United States Patent [19]

Watanabe et al.

[11] Patent Number: 4,730,132

[45] Date of Patent: Mar. 8, 1988

[54] SEMICONDUCTOR DEVICE HAVING BIPOLAR TRANSISTOR AND INSULATED GATE FIELD EFFECT TRANSISTOR WITH TWO POTENTIAL POWER SOURCE

[75] Inventors: Takao Watanabe, Kokubunji; Goro Kitukawa; Ryoichi Hori, both of Tokyo; Kiyoo Itoh, Higashikurume; Yoshiki Kawajiri, Hachioji; Takayuki Kawahara, Kokubunji, all of Japan

[73] Assignee: Hitachi, Ltd., Tokyo, Japan

[21] Appl. No.: 886,816

[22] Filed: Jul. 18, 1986

[30] Foreign Application Priority Data

Jul. 22, 1985 [JP] Japan .................................. 60-161467
Jan. 31, 1986 [JP] Japan .................................. 61-17929
Feb. 17, 1986 [JP] Japan .................................. 61-30846

[51] Int. Cl.[4] ............................................. H03K 19/01
[52] U.S. Cl. .................................... 307/446; 307/448; 307/449; 307/451; 307/475
[58] Field of Search ................ 307/443, 446, 448–449, 307/451, 454, 475, 570, 270

[56] References Cited

U.S. PATENT DOCUMENTS

| | | | |
|---|---|---|---|
| 3,631,528 | 12/1971 | Green | 307/303 X |
| 4,280,065 | 7/1981 | Minato et al. | 307/448 X |
| 4,301,383 | 11/1981 | Taylor | 307/446 X |
| 4,453,095 | 6/1984 | Wrathall | 307/475 |
| 4,469,959 | 9/1984 | Luke et al. | 307/451 X |
| 4,472,647 | 9/1984 | Allgood et al. | 307/475 |
| 4,558,234 | 12/1985 | Suzuki et al. | 307/446 |
| 4,616,146 | 10/1986 | Lee et al. | 307/451 X |
| 4,661,723 | 4/1987 | Masuda et al. | 307/446 |

OTHER PUBLICATIONS

Lin et al., "Complementary MOS-Bipolar Transistor Structure", IEEE Trans. Elect. Dev., vol. ED-16, No. 11, Nov. 1969, pp. 945-951.

Primary Examiner—Stanley D. Miller
Assistant Examiner—D. R. Hudspeth
Attorney, Agent, or Firm—Antonelli, Terry & Wands

[57] ABSTRACT

The invention relates to a semiconductor device which has a high density of integration and of which a low power consumption is required. The semiconductor device prevents the influence of the amplitude of an input signal upon the amplitude of an output signal in such a way that a preceding circuit and a succeeding circuit are provided with different reference voltages. The semiconductor device is constructed of a circuit which includes a bipolar transistor and an insulated-gate field effect transistor, and which operates with reference to one or more voltages, at least one of the reference voltages having a voltage value different from a reference operating voltage of a preceding circuit. A first switching circuit is interposed between a first reference voltage and an input node of a driver circuit, and a second switching circuit is interposed between an output of a preceding circuit and the input of the driver circuit, so that when an output signal of the preceding circuit is at a high level, the seconding circuit switch is turned "on" while the first switching circuit is turned "off" thereby to produce a still higher potential, and that when the output signal of the preceding circuit is at a low level, the second switching circuit is turned "off" while the first switching circuit is turned "on". The semiconductor device is suited to high-density DRAM and SRAM circuits which use voltage limiters.

12 Claims, 48 Drawing Figures

SEMICONDUCTOR DEVICE HAVING BIPOLAR TRANSISTOR AND INSULATED GATE FIELD EFFECT TRANSISTOR WITH TWO POTENTIAL POWER SOURCE

BACKGROUND OF THE INVENTION

The present invention relates to a semiconductor device, and more particularly to a circuit employing a bipolar transistor and an insulated gate field effect transistor (hereinbelow, termed 'IGFET') which is well-suited to attain a high driving capability and a large output amplitude.

Also, the present invention relates to, in a driving circuit including a bipolar transistor, especially to a driving circuit which is well-suited to reliably prevent the saturation of the bipolar transistor and to set an 'off' level at will and at high precision.

As a circuit employing a bipolar transistor and an IGFET, there has heretofore been a semiconductor device disclosed in the official gazette of Japanese Patent Application Laid-open No. 59-25423.

FIG. 1A is a circuit diagram of the semiconductor device. The operation of the circuit and the problem thereof will be explained with reference to FIG. 1A. This semiconductor device consists of the parallel connection between a circuit composed of CMOS (complementary MOS) transistors 4, 5 and a bipolar transistor 7 and a circuit composed of an IGFET 6 and a bipolar transistor 8. In the ensuing explanation, the voltage $V_{SS}$ of a lower source shall be assumed 0 V. When the potential of an input node I is 0 V, the P-channel IGFET 4 turns "on" and current flows to the base of the bipolar transistor 7, so that this bipolar transistor 7 turns "on". On the other hand, the bipolar transistor 8 does not turn "on" because the potential of the base thereof is 0 V. As a result, current flows to an output node O, the potential of which rises. The potential of the output node O finally becomes a value which is obtained by subtracting the base-emitter forward voltage $V_{BE}$ of the bipolar transistor 7 from the voltage $V_{CC}$ of an upper source. In this manner, with the prior-art circuit shown in FIG. 1A, the potential of the output node O does not rise up to the voltage $V_{CC}$ of the upper source.

Besides the circuit stated above, there has been driving circuitry disclosed in the official gazette of Japanese Patent Application Laid-open No. 59-8431 as a semiconductor device constructed of a circuit in which IGFETs and bipolar transistors are combined.

FIG. 1B is a diagram showing the circuit arrangement of the semiconductor device. The circuit in FIG. 1B is such that circuits composed of symmetrically arranged CMOS inverter circuits and bipolar transistors are connected in parallel across input and output nodes. The foregoing circuit in FIG. 1A delivers a signal having an inverted phase to the phase of an input, whereas the circuit in FIG. 1B delivers a signal having the same phase as that of an input. More specifically, when the input node I becomes a high level, an IGFET 13 turns "on" and current flows to the base of a bipolar transistor 17, so that this bipolar transistor 17 turns "on". Meanwhile, a P-channel IGFET 15 turns "off" and an N-channel IGFET 16 turns "on", so that the base potential of a bipolar transistor 18 becomes 0 V to turn "off" this bipolar transistor 18. As a result, current flows to the output node O, the potential of which rises. At this time, the potential of the output node O rises up to a value $V_{CC}-V_T-V_{BE}$ which is obtained by subtracting the threshold voltage $V_T$ of the N-channel IGFET 13 and the base-emitter forward voltage $V_{BE}$ of the bipolar transistor 17 from an upper source voltage $V_{CC}$. In this manner, the output level of the circuit in FIG. 1B becomes still lower than the output level in FIG. 1A.

As another example of driving circuitry constructed including a bipolar transistor, a circuit shown in FIG. 1C is disclosed in the official gazette of Japanese Patent Application Laid-open No. 59-8431. In this circuit, when an input node I becomes a low potential, a base current flows from a power source $V_{CC}$ to a bipolar transistor $Q_{2A}$ through a P-channel IGFET $M_{2A}$, to turn "on" the transistor $Q_{2A}$, so that an output node O becomes a high level. Besides, when the input node I becomes a high potential, an N-channel IGFET $M_{2C}$ turns "on", and a base current flows to a bipolar transistor $Q_{2B}$ to turn "on" this transistor $Q_{2B}$, so that the output node O becomes a low level. In this circuit, the collector of the bipolar transistor $Q_{2A}$ and the source of the P-channel IGFET $M_{2A}$ are connected. For this reason, when the bipolar transistor $Q_{2A}$ turns "on", the base potential thereof rises from a low potential near 0 V to the potential of the power source $V_{CC}$. Meanwhile, when the collector current of the bipolar transistor $Q_{2A}$ begins to flow, the collector potential thereof becomes lower than the potential of the power source $V_{CC}$ by the product between the collector current and a parasitic collector resistance in the bipolar transistor $Q_{2A}$ and a resistance parasitic to external collector wiring (both being omitted from illustration for the sake of brevity). Accordingly, when the collector resistance of the bipolar transistor $Q_{2A}$ is great, the base potential of this transistor $Q_{2A}$ might become higher than the collector potential thereof to establish the so-called saturation state. As is well known, when the bipolar transistor falls into the saturation state, large quantities of minority carriers are stored in the base, and a long time is required for turn-off. This causes a problem that a through current increases when the input I changes-over from the low level to the high level in the above operation. Next, the "off" level of the circuit in FIG. 1C will be considered. In this circuit, when the input node I has become the low level, the potential of the output node O begins to rise, and it finally rises up to a value which is obtained by subtracting the base-emitter forward voltage $V_{BE}$ of the bipolar transistor $Q_{2A}$ from the potential of the power source $V_{CC}$. In order to set the potential of the "off" level, accordingly, the potential of the power source $V_{CC}$ needs to be changed. Since, however, the power source $V_{CC}$ needs to feed the collector current of the bipolar transistor $Q_{2A}$ besides the base current thereof as described above, it requires a great capability of current supply, and it has been difficult to set the magnitude at will and at high precision.

To sum up, the following problems are revealed:

(1) The voltage of the output node O does not rise up to the upper source voltage $V_{CC}$. Since the low output voltage becomes a low input level for a succeeding circuit, the operation of the succeeding circuit slows, and the feature of high operating speed of the bipolar transistor cannot be satisfactorily achieved. In addition, this problem becomes acute when the microminiaturization of a device makes it necessary to lower a source voltage. Accordingly, a circuit is desired which can provide a sufficiently high output level while satisfactorily keeping the high driving capability of the bipolar transistor.

(2) The voltage of the high potential side of the input node I needs to be maintained at or above $V_{CC}-|V_{TP}|$ for the purpose of preventing a through current from flowing. Here, $V_{TP}$ denotes the threshold voltage of the P-channel IGFET. This signifies that, when the high level of the input voltage is lowered for the reduction of power consumption or the microminiaturization of the device, also the source voltage $V_{CC}$ must be inevitably lowered in order to prevent the through current. Consequently, the output voltage lowers still more.

(3) The bipolar transistor may saturate, and it has been difficult to set the value of the "off" level at will.

SUMMARY OF THE INVENTION

An object of the present invention is to eliminate the the problems of the prior art described above and to provide a semiconductor device which can maintain the high driving capability of a bipolar transistor and can produce a sufficiently high output level.

Another object of the present invention is to provide a semiconductor device which can produce a sufficiently high output voltage even for an input signal of small amplitude.

Another object of the present invention is to provide a driving circuit which is well-suited to reliably prevent a bipolar transistor from being saturated and to set the value of an "off" level at will and at high precision.

The present invention comprises means to supply a pertinent circuit with a source voltage which is higher than an input signal voltage. This signifies that the source voltage which is fed to the pertinent circuit is higher than the source voltages of a circuit which often delivers an input signal.

Further, the present invention disposes a source for the base current of a bipolar transistor independently of a source for the collector current thereof.

Thus, the potential of the collector of the bipolar transistor and that of the base thereof can be controlled independently, and hence, it is readily permitted to hold the collector potential higher than the base potential at all times. Accordingly, latch-up does not take place. Moreover, since the base current is usually as small as $1/h_{fe}=1/10-1/100$ of the collector current, the capability of current supply required of the base current source is allowed to be lower than in the prior-art circuit. Accordingly, the control of the base potential is facilitated, and the value of an "off" level can be set at will and at high precision. Therefore, the invention is particularly effective, for example, in a case where the logic amplitude of an internal circuit is to be made smaller than a source voltage which is fed from outside an LSI chip.

In addition, the semiconductor device of the present invention is constructed of a circuit which is fed with an input signal controlled by a preceding circuit and which includes at least one IGFET, said circuit having one or more source voltages, at least one of said source voltages being set higher than a source voltage of said preceding circuit for controlling said circuit, switching means being disposed between this source voltage and an input of said circuit, whereby a greater output signal amplitude independent of an input signal amplitude can be produced.

These and other objects and many of the attendant advantages of this invention will be readily appreciated as the same becomes better understood by reference to the following detailed description when considered in connection with the accompanying drawings.

DETAILED DESCRIPTION OF THE INVENTION

Now, embodiments of the present invention will be described in detail with reference to the drawings.

Embodiment

Figure 1A:
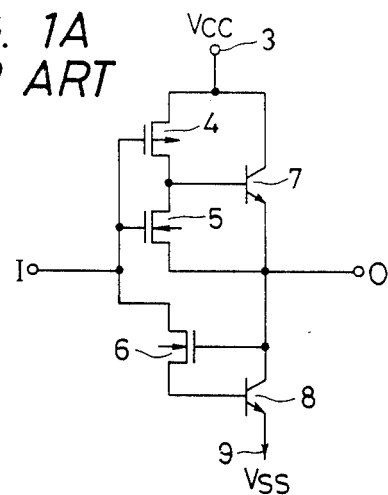
FIGS. 1A to 1C are circuit diagrams each showing a prior art.
Figure 1B:
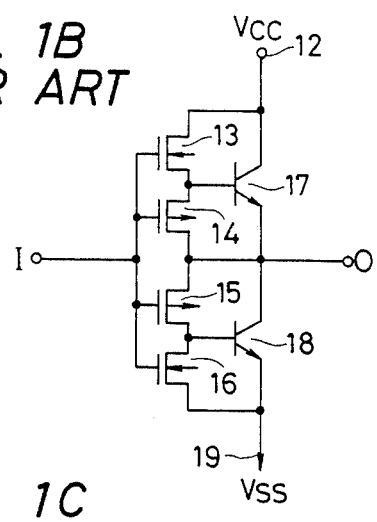
Figure 1C:
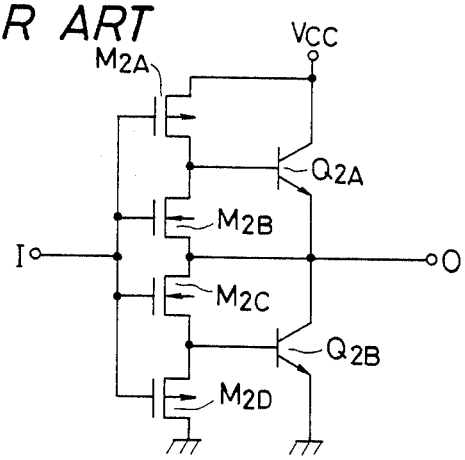
Figure 2:
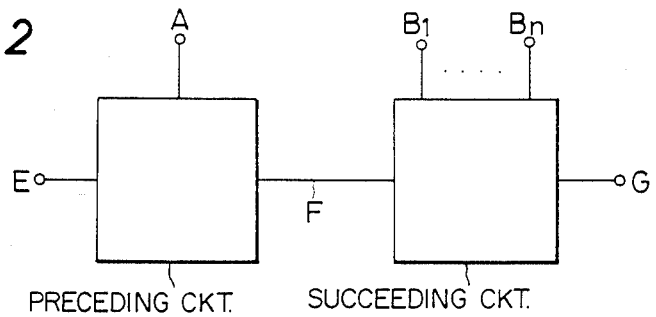
FIGS. 2 to 5 are diagrams for explaining a first embodiment of the present invention.

FIG. 2 is a diagram of an embodiment for explaining the concept of the semiconductor device of the present invention. Shown in FIG. 2 is a case of a circuit having one input and one output. In the figure, letter D denotes a combined circuit which includes bipolar transistors and IGFETs (or MIS or MOS transistors), while letter C denotes a preceding circuit which controls the circuit D. Letter A indicates a node to which the reference voltage of the operation of the circuit C is applied, and symbols $B_1-B_n$ indicate nodes to which the reference voltages of the operation of the circuit D are applied. Letter E indicates the input node of the circuit C, and letter G the output node of the circuit D. A connection line F is a signal line for transmitting a signal for controlling the circuit D, from the circuit C.

In the present invention, at least one of the voltages to be applied to the nodes $B_1-B_n$ is set higher than the voltage to be applied to the node A, whereby the level of a signal to be output to the node G is made higher than the level of the signal which is input to the circuit D through the signal line F. Thus, it becomes possible to generate a signal of high level while the feature of high operating speed of the bipolar transistor is kept.

Here, the voltages to be applied to the node A and the nodes $B_1$–$B_n$ may be ones of fixed levels or pulses as are needed, and in some case, a plurality of reference voltages may be fed to the circuit C. A plurality of signal lines F may well be used. The present invention is not restricted to the arrangement of FIG. 2, but it is also applicable to a multi-input and multi-output circuit. For the sake of brevity, however, embodiments based on the same arrangement as in FIG. 2 will be described below. It is assumed that, as the circuit C, a CMOS inverter as shown at C in FIG. 3 be used. In the inverter C in FIG. 3, a node A is connected to an upper source voltage $V_A$, but this is not restrictive as stated before.

Figure 3:
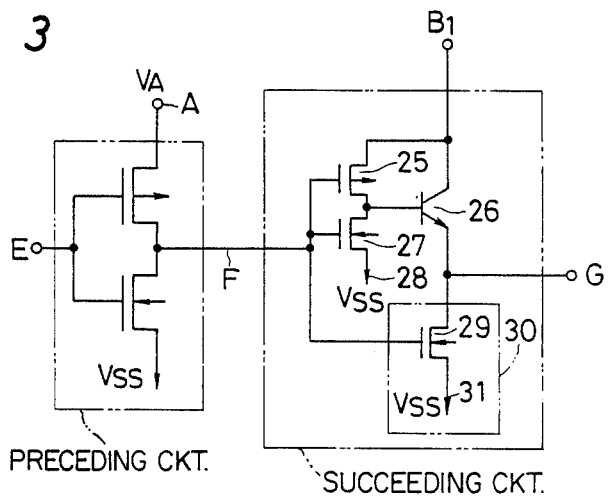

FIG. 3 is an arrangement diagram of a semiconductor device showing the details of the first embodiment of the present invention. In this embodiment, the reference pulse voltage of the operation of a circuit D is applied to a node $B_1$, and a level higher than the operating reference voltage $V_A$ of the preceding circuit C is delivered to an output node G.

Figure 4:
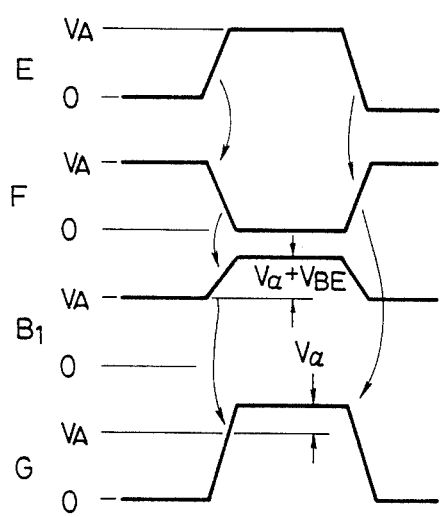

Now, the operation of the device in FIG. 3 will be described with reference to voltage waveforms in FIG. 4. Assuming that an input node E is at 0 V, the potential of a signal line F takes a high level and becomes steady at the voltage $V_A$ owing to the preceding circuit C shown in FIG. 3. The potential of the node $B_1$ at this time is $V_A$ in FIG. 4, but it may be set at or below $V_A + |V_{T25}|$ where $V_{T25}$ denotes the threshold voltage of a P-channel IGFET 25, so as to turn "off" this P-channel IGFET 25. When the potential of the signal line F becomes the high level, an N-channel IGFET 27 turns "on" to bring the base of a bipolar transistor 26 into 0 V, and the bipolar transistor 26 turns "off" to turn "on" an N-channel IGFET 29, so that the potential of the output node G becomes 0 V. Subsequently, the potential of the input node E is raised to $V_A$ to lower the potential of the signal line F (refer to FIG. 3) and to raise the potential of the node $B_1$ to or above $V_A$. On this occasion, the P-channel IGFET 25 turns "on", and the N-channel IGFET 27 turns "off". A base current flows through the bipolar transistor 26, and this bipolar transistor 26 turns "on". Since the signal line F is at the low potential, the N-channel IGFET 29 turns "off", so that current flows to the output node G to raise the potential thereof. The potential of the output node G arrives at a value which is obtained by subtracting the base-emitter forward voltage $V_{BE}$ of the bipolar transistor 26 from the potential of the base thereof. Therefore, when a desired output level at the output node G is denoted by $V_A + V_\alpha (V_\alpha \geq 0)$, it is obtained by boosting the potential of the node $B_1$ to $V_A + V_\alpha + V_{BE}$.

When the potential of the input node E is shifted to 0 V and the potential of the node $B_1$ is brought back to $V_A$, the potential of the signal line F rises to $V_A$ as stated before, to turn "off" the bipolar transistor 26 and to turn "on" the N-channel IGFET 29, so that the potential of the output node G becomes 0 V. The potential of the node $B_1$ at this time can be set at any desired value not greater than $V_A + |V_{T25}|$ as described before, and can be equalized to $V_A$ by way of example.

As thus far described, according to Embodiment 1, the potential of the node $B_1$ to be applied when the signal received from the signal line F is the low voltage is set at will, whereby the output of the high voltage can be produced while the feature of high operating speed of the bipolar transistor is kept.

Figure 5:
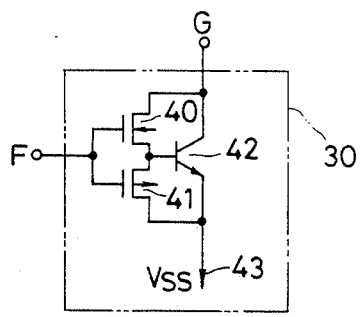

In FIG. 3, the N-channel IGFET 29 for lowering the potential of the output node G can be replaced with an arrangement shown at numeral 30 in FIG. 5. That is, the circuit D comes to have an arrangement in which combinations each consisting of the inverse CMOS transistors and the bipolar transistor are connected in parallel. In this case, current flowing through an N-channel IGFET 40 is amplified by a bipolar transistor 42, so that the lowering of the potential of the output node can be effected fast. Herein, however, the potential of the output node G does not lower perfectly to 0 V because it is limited by the base-emitter forward voltage of the bipolar transistor 42. In a case where the potential of the output node G needs to be lowered perfectly to 0 V, the arrangement 30 in FIG. 5 may be disposed in parallel with the N-channel IGFET 29 in FIG. 3. In FIG. 5, a P-channel IGFET 41 serves to discharge charges stored in the base of the bipolar transistor 42 when the signal line F was 0 V and to reliably turn "off" this bipolar transistor 42.

Embodiment 2

Figure 6:
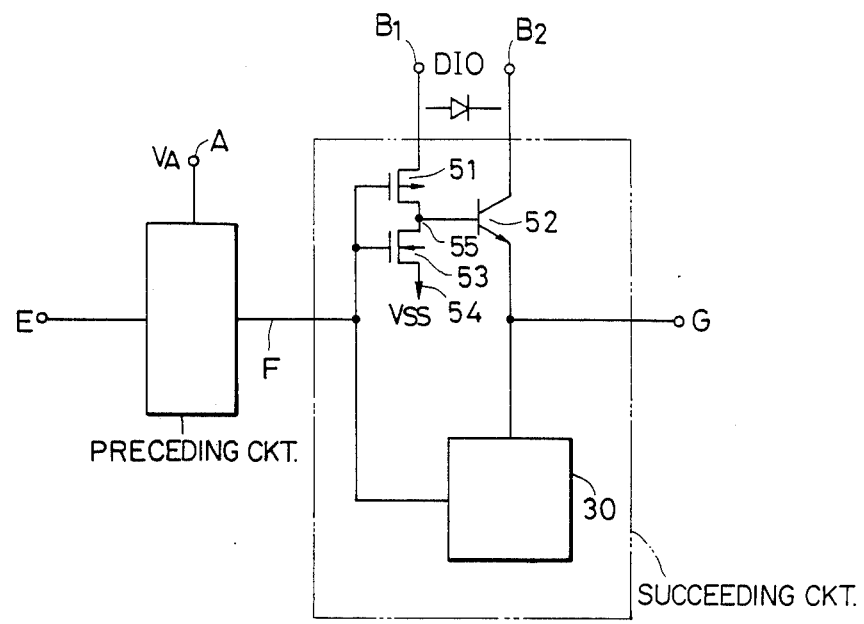
FIG. 6 is a diagram for explaining a second embodiment of the present invention.

FIG. 6 is an arrangement diagram of a semiconductor device showing a second embodiment of the present invention.

The difference between this embodiment and the embodiment in FIG. 3 is that, in FIG. 3, the collector of the bipolar transistor 26 and the source of the P-channel IGFET 25 are connected to the node $B_1$, whereas in FIG. 6, only the source of a P-channel IGFET 51 is connected to a node $B_1$, which is not connected to the collector node $B_2$ of a bipolar transistor 52. That is, in the arrangement of FIG. 6, only the base current of the bipolar transistor 52 may be fed from the node $B_1$. Accordingly, as compared with the case of feeding both the base and collector currents of the bipolar transistor 26 from the node $B_1$ as in FIG. 3, the embodiment lightens the burden of a circuit for driving the node $B_1$ and therefore becomes capable of a high speed operation. The other operations are the same as in FIG. 3.

In FIG. 6, the collector of the bipolar transistor 52 is connected to the node $B_2$ and can have its potential set independently of the node $B_1$ for feeding the current to the base 55 of this transistor. By holding the potential of the node $B_2$ higher than that of the base 55 of the bipolar transistor 52, accordingly, this bipolar transistor 52 can be reliably prevented from getting saturated. To this end, a pulse voltage having an amplitude not smaller than the base voltage of the bipolar transistor 52 may be impressed on the node $B_2$ in synchronism with the potential fluctuation of the base 55, or the potential of the node $B_2$ may be held at a fixed value higher than the upper limit of the potential of the base 55. In the latter case, when the signal line F has become the high level to shift the potential of the output node G to the low level, a high voltage acts on the collector-emitter path of the bipolar transistor 52. At this time, however, no problem is posed for the reason that the base 55 is grounded by an N-channel IGFET 53, so the breakdown voltage of the bipolar transistor 52 is determined by $BV_{CES}$ (grounded-base collector-emitter breakdown voltage) and becomes higher than in case of holding the base in a floating state. In a case where, in the arrangement of FIG. 6, the bipolar transistor 52 might be deeply saturated temporarily due to the fluctuation of a supply voltage, etc., a diode DIO may be inserted between the nodes $B_1$ and $B_2$ as shown in the figure, whereby when the potential of the node $B_1$ has become abnormally high, current is caused to flow through the diode so as to prevent the deep saturation of the bipolar transistor 52. It is as described before that, in FIG. 6, the circuit 30 for lowering the potential of the output node G may be constructed, as is necessary, of only the IGFET 29 as shown in FIG. 3, of the bipolar transistor and the IGFETs as shown in FIG. 5, or of the two connected in parallel.

Embodiment 3

Figure 7:
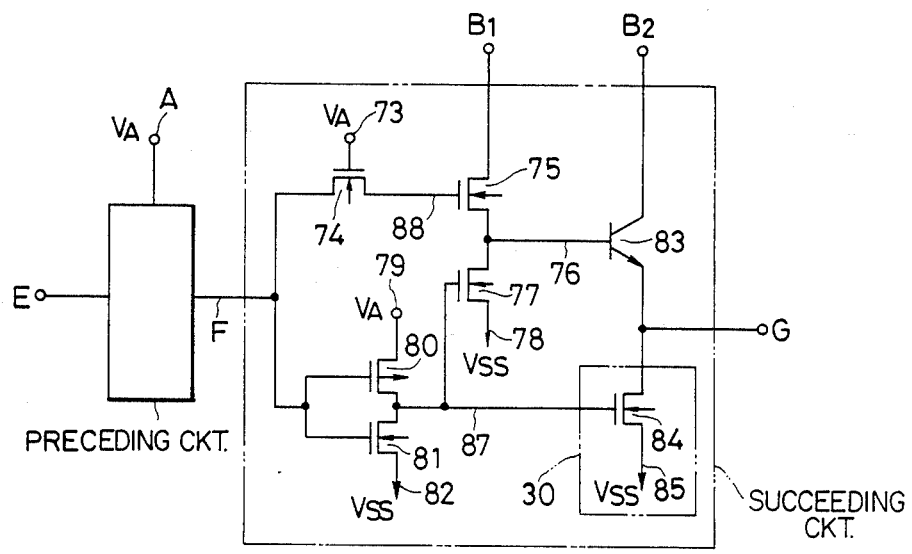
FIGS. 7 and 8 are diagrams for explaining a third embodiment of the present invention.

FIG. 7 is an arrangement diagram of a semiconductor device showing a third embodiment of the present invention.

The difference in circuitry between FIG. 7 and FIG. 6 is that, in FIG. 6, the circuit D performs an inserting operation of delivering a signal having the inverted phase to the phase of a signal received from the signal line F, whereas in FIG. 7, a circuit D performs the operation of delivering a signal having the same phase as that of an input F.

In FIG. 7, a bipolar transistor 83 is a transistor for supplying current to an output node G so as to raise the potential of this node G. An N-channel IGFET 84 is a transistor for providing current from the output node G to a lower source voltage $V_{SS}$ so as to lower the potential of this node G. The other IGFETs serve to control the on/off of the bipolar transistor 83 and the IGFET 84.

Figure 8:
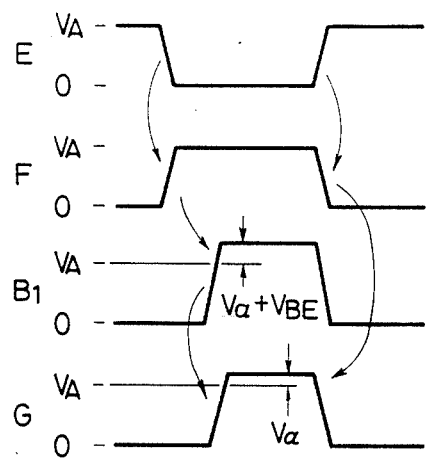

Now, the operation of the embodiment in FIG. 7 will be described with reference to voltage waveforms in FIG. 8.

In the illustration, for the sake of brevity, the potential of a node $B_2$ is assumed to be held at a fixed value higher than the upper limit value of the potential of the base 76 of the bipolar transistor 83. However, a pulse voltage synchronized with the potential fluctuation of the base 76 may well be applied within a range within which the bipolar transistor 83 is not saturated. Letting the potential of an input node E be $V_A$, the potential of the signal line F is rendered 0 V by a circuit C, and hence, the N-channel IGFET 75 turns "off", the P-channel IGFET 80 turns "on" and the N-channel IGFET 81 turns "off", so that the potential of a part 87 becomes $V_A$. As a result, the N-channel IGFET 77 turns "on", the bipolar transistor 83 turns "off" and the N-channel IGFET 84 turns "on", so that the output node G becomes 0 V. Subsequently, when the input node E is lowered to 0 V, the potential of the signal line F becomes $V_A$, with the result that the gate 88 of the N-channel IGFET 75 is charged to a voltage which is obtained by subtracting the threshold voltage of the N-channel IGFET 74 from the potential $V_A$. Meanwhile, the P-channel IGFET 80 turns "off" and the N-channel IGFET 81 turns "on", so that the potential of the part 87 becomes 0 V, and the N-channel IGFETs 84 and 77 turn "off".

When, under this state, the potential of a node $B_1$ is boosted to $V_A$ or above, the gate 88 of the N-channel IGFET 75 is boosted to a potential higher than that of the node $B_1$ by the self-capacitance between the gate 88 and the node $B_1$ because the gate 88 of the IGFET 75 has been previously charged to the voltage obtained by subtracting the threshold voltage of the N-channel IGFET 74 from $V_A$. For this reason, current flows to the base 76 of the bipolar transistor 83, and the potential of this base 76 rises up to the potential of the node $B_1$ without being limited by the threshold voltage of the N-channel IGFET 75. As a result, the potential of the output node G rises up to a value which is obtained by subtracting the base-emitter forward voltage $V_{BE}$ of the bipolar transistor 83 from the potential of the node $B_1$. Letting a desired output level be $V_A + V_\alpha$, the potential of the node $B_1$ may be made $V_A + V_\alpha + V_{BE}$. Since the N-channel IGFET 74 has the voltage of its gate 73 set at $V_A$, it turns "off" and functions to prevent the counter flow of current from the gate 88 to the signal line F when the gate 88 has been boosted to or above $V_A$. Subsequently, when the potential of the input node E is raised to $V_A$ and the potential of the node $B_1$ is lowered, the signal line F becomes 0 V and the gate 87 becomes $V_A$. Thus, while the bipolar transistor 83 remains turned "off", the N-channel IGFET 84 turns "on" to bring the output node G to 0 V. On this occasion, it is the same as in the case of FIG. 6 that, since the base 76 of the bipolar transistor 83 is grounded through the N-channel IGFET 77, the breakdown voltage of this bipolar transistor 83 rises, whereupon the bipolar transistor 83 is less likely to fall into the breakdown mode even in the state in which the high voltage of the node $B_2$ is held applied. As thus far described, this embodiment makes it possible to generate the signal of the high output level similar to the input.

As a circuit 30 for lowering the potential of the output node G, the circuit in FIG. 5 may be used or the circuit in FIG. 5 and the N-channel IGFET 84 connected in parallel may well be used as is necessary. Besides, in a case where the bipolar transistor 83 might be deeply saturated temporarily due to the fluctuation of a supply voltage, etc., a diode may be connected between the nodes $B_1$ and $B_2$ as shown in FIG. 6, to prevent the potential of the node $B_1$ from abnormally rising relative to that of the node $B_2$.

Embodiment 4

Figure 9:
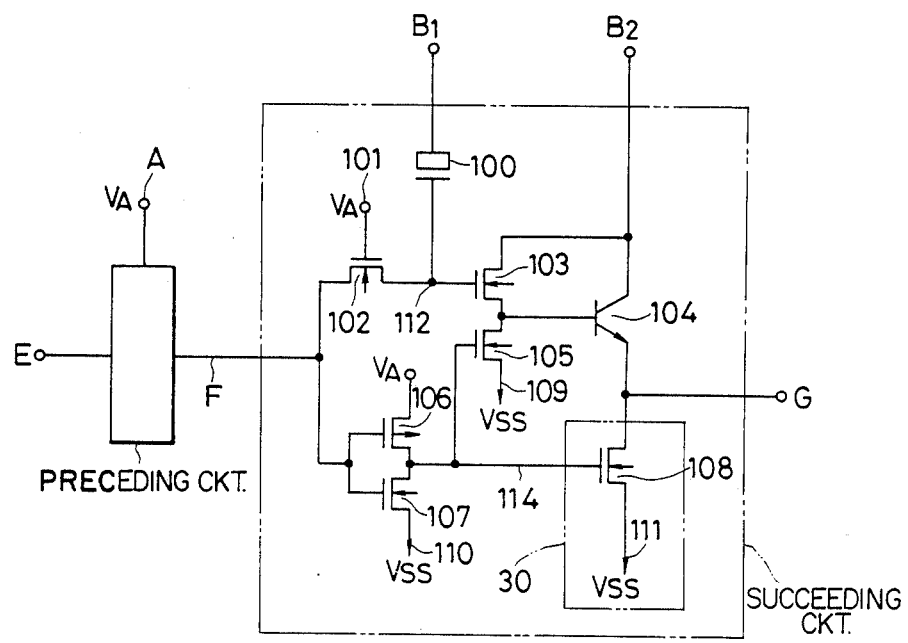
FIG. 9 is a diagram for explaining a fourth embodiment of the present invention.

FIG. 9 is an arrangement diagram of a semiconductor device showing a fourth embodiment of the present invention.

The greatest difference in circuitry between FIG. 7 and FIG. 9 is that, in FIG. 7, the collector and base of the bipolar transistor 83 are electrically isolated, whereas in FIG. 9, an N-channel IGFET 103 is inserted between the collector and base of a bipolar transistor 104 so as to feed a base current and a collector current from a node $B_2$.

Now, the operation of this embodiment will be described. It is assumed that a desired output level be $V_A + V_\alpha$ and that a voltage $V_A + V_\alpha + V_{BE}$ be applied to the node $B_2$. Here, $V_{BE}$ denotes the base-emitter forward voltage of the bipolar transistor 104. When the potential of an input node E is lowered from $V_A$ to 0 V in the state in which a node $B_1$ is at 0 V, the gate 112 of the N-channel IGFET 103 is charged to a potential obtained by subtracting the threshold voltage of an N-channel IGFET 102 from $V_A$, likewise to the case of FIG. 7. At this time, since N-channel IGFETs 105 and 108 are "off", current flows from the node $B_2$ to the base of the bipolar transistor 104 to turn "on" this bipolar transistor 104, and current flows to an output node G to raise the potential of this node G. Letting $V_{T102}$ and $V_{T103}$ denote the threshold voltages of the N-channel IGFETs 102 and 103 respectively, the base potential of the bipolar transistor 104 rises only to $V_A - V_{T102} - T_{T103}$, and the potential of the output G further drops by $V_{BE}$. If this condition, is maintained accordingly, an output level not lower than $V_A$ cannot be produced. Therefore, a pulse voltage is impressed on the node $B_1$ under the state under which the gate 112 has been charged, whereby the potential of the gate 112 is boosted to or above $V_A+V_\alpha+V_{BE}+V_{T103}$ by a capacitor 100. As a result, the base potential of the bipolar transistor 104 rises up to $V_A+V_\alpha+V_{BE}$, and the potential of the output node G reaches the desired output level $V_A+V_\alpha$. In this embodiment, the base potential of the bipolar transistor 104 rises only to the level equal to that of the node $B_2$. Therefore, even when the potential of the node $B_2$ has lowered for any cause, the bipolar transistor 104 is not saturated. Subsequently, when the potential of the input node E is raised from 0 V to $V_A$, a signal line F becomes 0 V. Then, N-channel IGFETs 103 and 107 turn "off", a P-channel IGFET 106 turns "on" and the N-channel IGFET 105 turns "off". Consequently, the bipolar transistor 104 turns "off" and the N-channel IGFET 108 turns "on", so that the potential of the output node G becomes 0 V. In this embodiment, it is the same as in the case of the embodiment in FIG. 7 that a circuit 30 for lowering the potential of the output node G may have the arrangement of FIG. 5 or may have the circuit of FIG. 5 connected in parallel with the N-channel IGFET 108 in FIG. 9, as is necessary. In addition, although in the above description the potential of the node $B_2$ has been the fixed level of $V_A+V_\alpha+V_{BE}$, a pulse voltage varying from 0 V to $V_A+V_\alpha+V_{BE}$ may well be impressed on the node $B_2$ after the gate 112 has been charged. Since, on this occasion, the potential of the gate 112 is boosted by the self-capacitance between the gate 112 of the N-channel IGFET 103 and the node $B_2$, the capacitor 100 and the node $B_1$ are not necessarily required.

In this manner, according to the present embodiment, in a circuit which includes a bipolar transistor and an IGFET, an operating reference voltage is set at a value different from the reference voltage of a preceding circuit which controls the above circuit, thereby making it possible to realize a semiconductor device which has a high output amplitude of or above the reference voltage of the preceding circuit while exploiting the high driving capability of the bipolar transistor to the fullest.

In the embodiments thus far described, a pulse voltage needs to be impressed on the node $B_1$. There are various circuits for generating pulse voltages, the circuit arrangements of which are well known, and hence, they shall not be clearly shown here. By way of example, as a circuit which generates pulse voltages as shown by the voltage waveforms in FIG. 8, there is a circuit "256k CMOS Dynamic RAM with Static Column Mode of Cycle Time of 50 ns" by Ishihara, Miyazawa and Sakai, shown in 'Nikkei Electronics', Feb. 11, 1985, pp. 243-263, FIG. 7. Besides, in the embodiments thus far illustrated, the source of a P-channel IGFET (for example, 25 in FIG. 3) can become a high potential. In this regard, it is needless to say that the potential of the well of the P-channel IGFET needs to be held higher than the potential of the source so as to prevent the flow of an excess forward current, namely, latch-up from taking place between the source and the well. Further, in the foregoing embodiments, a high voltage can act between the drain and source of an N-channel IGFET (for example, 29 in FIG. 3). In this regard, in a case where a problem is posed with breakdown voltage, the voltage acting between the drain and source of the N-channel IGFET may be reduced in such a way that an N-channel IGFET whose gate potential is $V_A$ is inserted in series between the drain of the N-channel IGFET and a node to which this drain is connected.

While various uses are considered for the present invention, the invention is particularly suitable for the word driver of a dynamic semiconductor memory. The reason is that the realization of a high-speed dynamic semiconductor memory requires the raising of the signal-to-noise ratio by driving a selected word line at high speed and with a large amplitude and increasing signal amplitude and also raising the soft error immunity by increasing storage charges.

Embodiment 5

Next, there will be explained an example in the case where the present invention is applied to the word driver of a dynamic semiconductor memory.

Figure 10A:
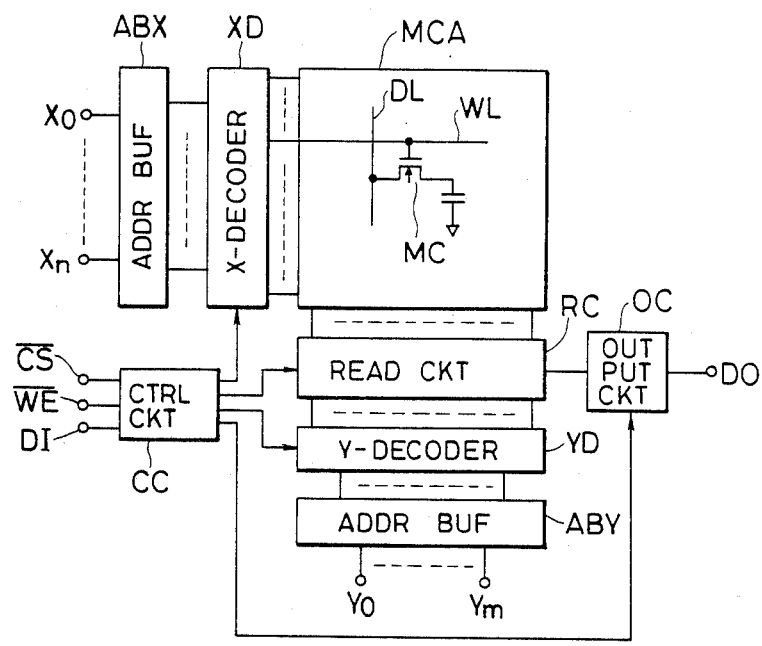
FIGS. 10A to 14 are diagrams for explaining a fifth embodiment of the present invention.

FIG. 10A is a block diagram of the dynamic semiconductor memory, which shows a memory cell array MCA of N bits and peripheral circuits.

In the memory cell array MCA, i word lines WL and j data lines DL are laid out orthogonally to each other, and memory cells MC are arranged at N of the intersection points between the word lines and the data lines. Address inputs $X_0-X_n$ and $Y_0-Y_m$ are respectively applied to address buffers ABX and ABY, the outputs of which are respectively transmitted to decoders/drivers XD and YD. The circuit XD drives the word line, and the circuit YD drives a write/read circuit RC, so as to write or read data into or from a selected memory cell MC in the memory cell array MCA. Symbol CC denotes a write/read control circuit, which controls the address buffers ABX, ABY, the decoders/drivers XD, YD, the write/read circuit RC and an output circuit OC in accordance with a chip select signal $\overline{CS}$, a write enable signal $\overline{WE}$ and an input signal DI. The output circuit OC is a circuit which serves to deliver out the data read by the write/read circuit RC.

By applying the circuit of this embodiment to the decoder/driver XD in the above arrangement, it is permitted to drive the level of the word line WL at high speed and with a large amplitude, and a dynamic memory of high operating speed and high stability can be realized.

In FIG. 10A, the write/read circuit RC can also have a part thereof arranged at the end of the memory cell array MCA opposite to the decoder/driver YD so as to receive control signals from the decoder/driver YD by passing them over the memory cell array MCA. Besides, although the X-group address inputs $X_0-X_n$ and the Y-group address inputs $Y_0-Y_m$ are applied from the separate input nodes in FIG. 10A, it is also possible to adopt the so-called 'address multiplex system' wherein these input nodes are shared and the inputs are applied with time differences as stated in, for example, 1977 ISSCC "Digest of Technical Papers", pp. 12–13.

Figure 10B:
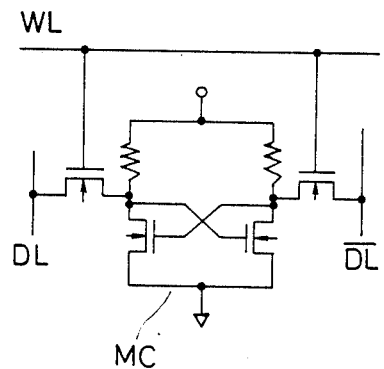

In that case, the aforementioned write/read control circuit may be driven in such a way that signals for controlling the acceptance of addresses, namely, the so-called $\overline{RAS}$ and $\overline{CAS}$ are substituted for the chip select signal $\overline{CS}$. The memory cell MC may well be a static memory shown in FIG. 10B.

Figure 11:
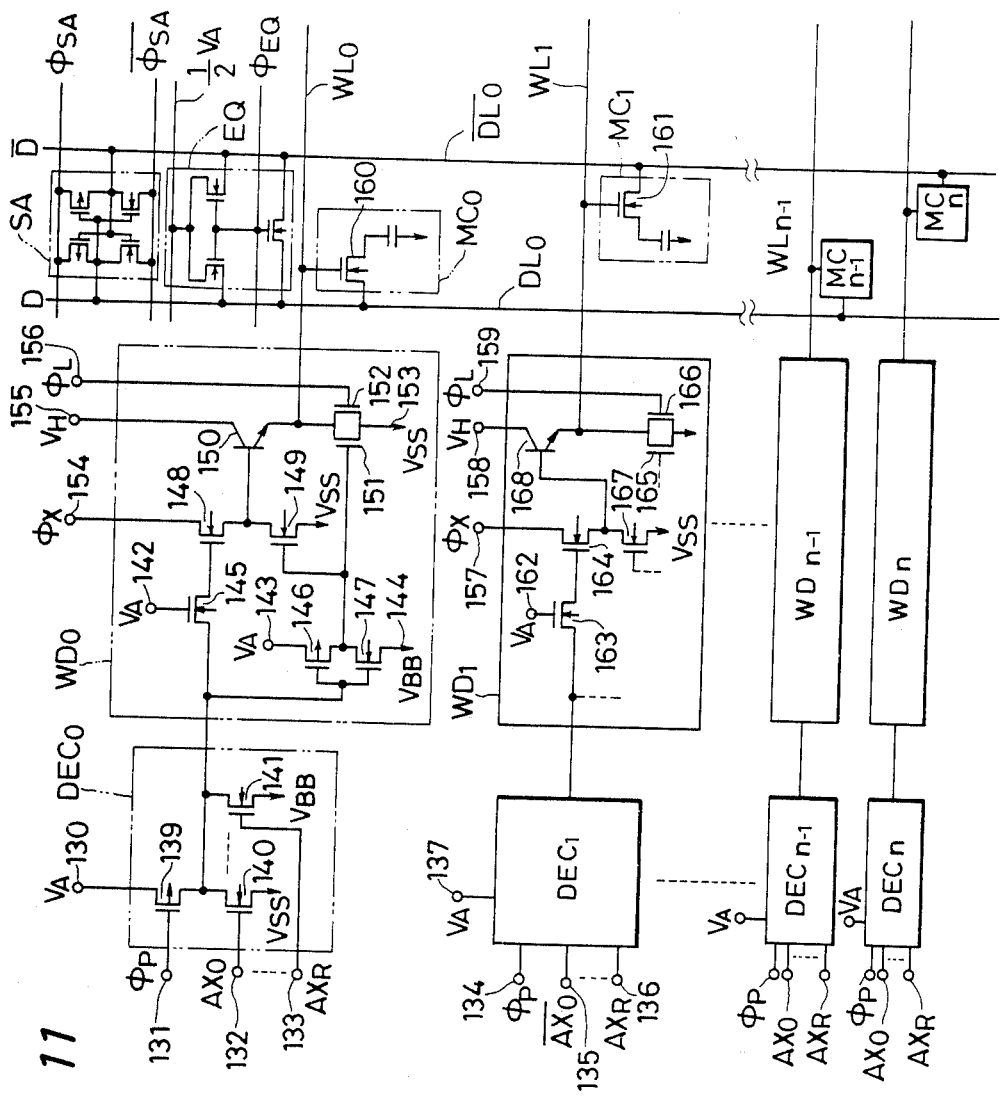

FIG. 11 is a diagram of an embodiment in which the arrangement of FIG. 10A is put into a more concrete form, and which shows parts of the memory cell array MCA and the decoder/driver XD more specifically.

In FIG. 11, $DEC_0$ and $DEC_1$ indicate decoders, $WD_0$ and $WD_1$ word drivers, $WL_0$ and $WL_1$ word lines, $DL_0$ and $\overline{DL_0}$ a pair of data lines, and $MC_0$ and $MC_1$ memory cells. EQ indicates an equalizer for balancing the potentials of the data lines, in other words, a circuit for precharging the data lines to $V_A/2$, and SA a sense amplifier.

The decoders $DEC_0$ and $DEC_1$ operate with reference to a voltage $V_A$ applied to nodes 130 and 137 respectively. The word drivers $WD_0$ and $WD_1$ to which the present invention is applied operate with reference to a pulse voltage $\phi_X$ impressed on nodes 154 and 157, a voltage $V_H$ applied to nodes 155 and 158, and a pulse voltage $\phi_L$ impressed on nodes 156 and 159, respectively. Here, the voltage $V_H$ is of course set at a potential which does not saturate bipolar transistors 150 etc.

Figure 12:
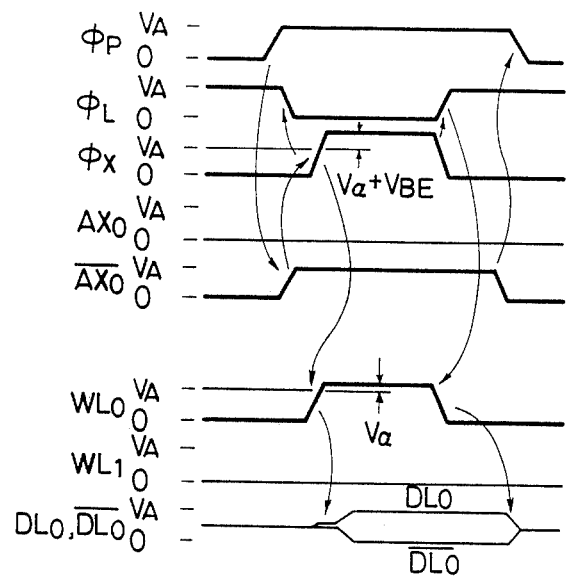

The circuit arrangement of each of the word drivers $WD_0$ and $WD_1$ is the same as that of the circuit D in FIG. 7 except the fact that an N-channel IGFET 152 or 166 is disposed in parallel with an N-channel IGFET 151 or 165. Now, a reading operation in FIG. 11 will be described in conjunction with voltage waveforms in FIG. 12.

In starting the reading operation, the pair of data lines $DL_0$ and $\overline{DL_0}$ are brought to equal potentials of about $\frac{1}{2} V_A$ by the equalizer EQ and are thereafter brought into floating states. On the other hand, under the state under which all address buffer outputs $A_{X0}, \overline{A_{X0}}, \ldots$ and $A_{XR}, \overline{A_{XR}}$ are held at 0 V, a precharge signal $\phi_P$ is rendered 0 V to precharge the gates of N-channel IGFETs 148 and 164 to voltages obtained by subtracting the threshold voltages of N-channel IGFETs 145 and 163 from the voltage $V_A$, respectively. Here are illustrated only the two word drivers, but in actuality, all the word drivers are simultaneously precharged. Subsequently, the precharge signal $\phi_P$ is raised, whereupon either of the affirmative and negative of the address buffer outputs rises, in accordance with which some of N-channel IGFETs in the decoders DEC turn "on", and among the precharged gates of the IGFETs, those of unselected word drivers other than a word driver connected to a word line to be selected become 0 V. Illustrated here is a case where the word line $WL_0$ is selected, and the gate of the N-channel IGFET 148 remains precharged. On the other hand, the gate of the N-channel IGFET 164 becomes 0 V because the word line $WL_1$ is unselected. In addition, since the output of the decoder $DEC_1$ becomes 0 V, the unselected word line $WL_1$ is fixed to 0 V in such a way that the N-channel IGFET 165 in the word driver $WD_1$ turns "on". Subsequently, when the word latch signal $\phi_L$ is lowered and the signal $\phi_X$ is raised from 0 V to $V_A + V_\alpha + V_{BE}$, the gate of the N-channel IGFET 148 in the word driver $WD_0$ is boosted because of the precharge, and the potential of the word line $WL_0$ rises to $V_A + V_\alpha$ similarly to the circuit operation in FIG. 7. On the other hand, the gate of the N-channel IGFET 164 in the word driver $WD_1$ is not boosted because of the voltage of 0 V, and this N-channel IGFET 164 remains "off", so that the potential of the word line $WL_1$ remains at 0 V. When the potential of the selected word line $WL_0$ rises, an N-channel IGFET 160 in the memory cell $MC_0$ turns "on", a signal is read out from the memory cell $MC_0$ to the data line $DL_0$, and a minute potential difference develops between the data line $DL_0$ and the paired data line $\overline{DL_0}$.

The potential difference between the pair of data lines is amplified by the sense amplifier SA, and data is rewritten into the memory cell and is transmitted to a succeeding circuit. Subsequently, the pulse signal $\phi_X$ is lowered to 0 V and the latch signal $\phi_L$ is raised to lower the word line $WL_0$ to 0 V, whereupon the pair of data lines are brought to the equal potentials of about $\frac{1}{2} V_A$ by the equalizer EQ. Meanwhile, all the address buffer outputs are lowered, and the precharge signal $\phi_P$ is lowered to 0 V to perform precharging so as to make ready for the next operation. In the above reading operation, the potential of the selected word line can be raised at high speed and with a large amplitude since the circuit of the present embodiment is applied to each of the word drivers $WD_0, WD_1, \ldots$. As a result, the signal voltage and the storage voltage of the memory cell can be increased, and a high speed operation and a high reliability are compatible. In FIG. 11, as the circuit for generating the pulse signal $\phi_X$, the circuit contained in "Nikkei Electronics" referred to before may be employed, and in order to attain a still higher speed, the embodiment in FIG. 6 may well be employed by way of example. Besides, although in FIG. 11 each word driver is provided with the decoder and the pulse signal $\phi_X$ is input to all the word drivers in common, various modifications are of course possible in such a manner that a single decoder is shared by a plurality of word drivers as is necessary and that the pulse signal of only one of the word drivers sharing the decoder is decoded and input.

Although the example of setting the precharge voltages of the data lines to $V_A/2$ has been illustrated here, the precharge voltages are not restricted thereto but can be set at will within a range of $0-V_A$.

In the reading operation stated above, the bipolar transistors in the unselected word drivers, for example, the transistor 168 in the word driver $WD_1$ have their bases held at 0 V by the signal $\phi_X$ when this signal is 0 V and by IGFETs inserted between the bases of the above bipolar transistors and a lower source voltage $V_{SS}$, for example, a FET 167 in the word driver $WD_1$ when the signal $\phi_X$ rises. The breakdown voltages of the above bipolar transistors are accordingly determined by $BV_{CES}$ as stated before, so that no problem is posed even when the collectors of the transistors are left at the high voltage $V_H$.

Meanwhile, the arrangement of FIG. 11 requires the two upper voltage sources of the source for supplying the voltage $V_A$ and the source for supplying the voltage $V_H$. It is of course possible to separately supply the source voltages from outside the chip, but it is also possible to externally supply only one of the voltages and to generate the other inside the chip with reference to the external voltage and supply the generated voltage or to generate both the source voltages inside the chip with reference to another voltage source. Accordingly, those of the embodiment of FIG. 11 and the preceding embodiments which require the two upper source voltages can also be constructed by the use of a single external upper voltage source in such a way that, by way of example, the higher one of the two voltages is fed directly from the external upper voltage source, while the lower one is fed by lowering the external upper source voltage by means of a voltage limiter circuit disclosed in any of the specifications of Japanese Patent Application No. 56-168698, Japanese Patent Application No. 57-220083, etc. In some cases, it is also allowed to feed the lower one of the two required source voltages from an external upper voltage source and to feed the higher one by raising the voltage of the external upper voltage source by means of a booster circuit.

Figure 13:
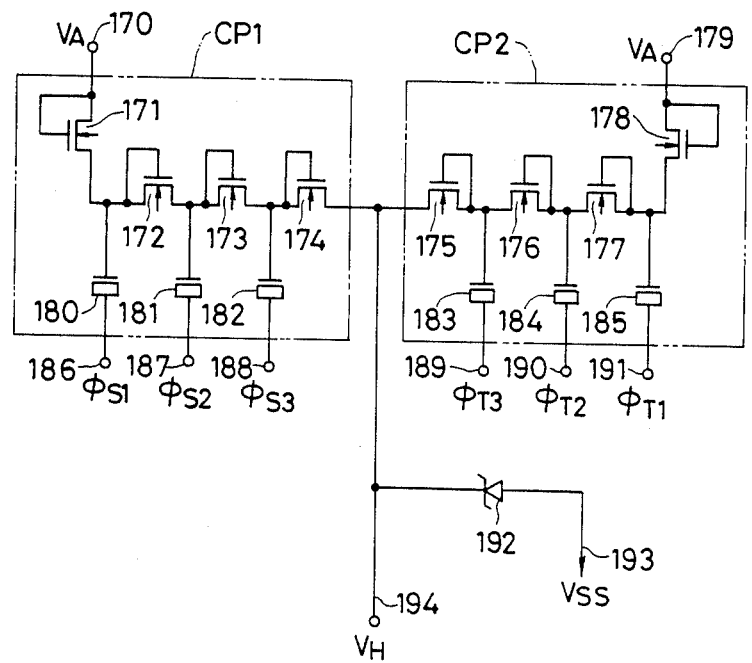

FIG. 13 is a diagram of one embodiment of a booster circuit for use in the present invention.

In this circuit, the voltage $V_A$ is supplied from an external upper voltage source so as to generate the high voltage $V_H$. The circuit in FIG. 13 is basically such that booster circuits CP1 and CP2 of the so-called charge pump type are arrayed in parallel. Since the operating principle of the charge pump type booster circuit is well known, it shall be omitted herefrom. Here, a Zener diode 192 serves, when the voltage of a node 194 has become much higher than the desired level $V_H$, to leak current and to prevent a further potential rise. However, it may be removed if it is not necessary. The Zener diode 192 may well be replaced with a plurality of ordinary diodes or MIS diode circuits each having the gate and drain of a MIS transistor connected, which are connected in the forward direction. Shown as each of the booster circuits $CP_1$ and $CP_2$ is an example in which MIS capacitors and diodes constructed of MIS transistors are connected in three stages. In general, however, when n denotes the number of stages, $V_T$ the threshold voltage of the MIS transistor and $V_A$ the amplitudes of pulses $\phi_{S1}-\phi_{S3}$ and $\phi_{T1}-\phi_{T3}$, a voltage to be produced becomes approximately $(n+1)(V_A-V_T)$, and the value n may be selected according to the required value of $V_H$.

In case of applying this circuit to the arrangement of FIG. 11, current which must be fed from the node 194 in FIG. 13 increases when the word line is selected. Accordingly, it is also possible to operate both the booster circuits $CP_1$ and $CP_2$ for producing the large feed current during the period of time during which the dynamic semiconductor memory is active, and to operate only the booster circuit $CP_1$ during the period of time during which the memory stands by. Thus, a great output current can be attained with a low power consumption.

Figure 14:
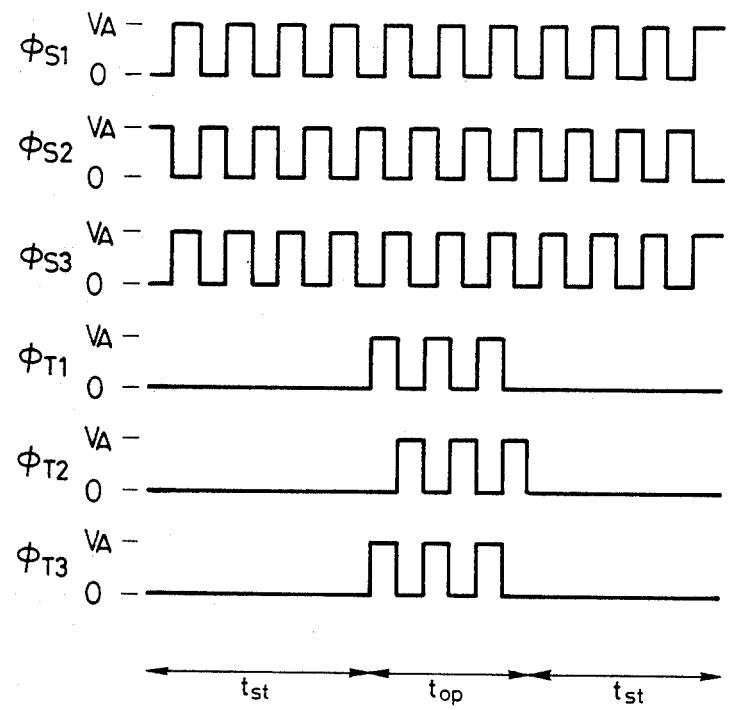

FIG. 14 is a diagram exemplifying the voltage waveforms of the pulses which are impressed on the booster circuits $CP_1$ and $CP_2$ in FIG. 13.

In the illustrated example, only the booster circuit $CP_1$ operates during the standby period $t_{st}$, and both the booster circuits $CP_1$ and $CP_2$ operate during the active period $t_{op}$. In order to synchronize the time at which the booster circuit $CP_2$ starts and the time at which the word line is selected, the chip select signal $\overline{CS}$ or the RAS signal, for example, may be utilized. In case of an operation as in the so-called page mode in which the data items of memory cells on a single word line are successively read out, the potential of the selected word line needs to be held at a high level for a long time. In this case, the booster circuit $CP_2$ may of course be activated by utilizing the CAS signal or the like even after the word line potential has reached the high level.

Although the example employing the two charge pump circuits has been shown here, it is a matter of course that one circuit or three or more circuits may well be employed as is necessary. Besides, when the potential of the word line is raised very fast, the potential of the node 194 in FIG. 13 sometimes lowers temporarily. In that case, in order to prevent the saturation of a bipolar transistor whose collector has the node 194 connected thereto, the capacitance of the node 194 needs to be increased so as to reduce the lowering of the potential. To this end, all the collectors of bipolar transistors for feeding the voltage $V_H$ are connected to the node 194, whereby the parasitic capacitance of the node 194 owing to the collector capacitances of the bipolar transistors. Besides, although the pulses $\phi_{S1}$ and $\phi_{S3}$ and those $\phi_{T1}$ and $\phi_{T3}$ have been respectively indicated as separate signals here, the charge pump circuits can be driven by the same signals in some cases.

In a case where a bipolar transistor might be temporarily saturated by the fluctuation of a supply voltage, the saturation may be prevented in such a way that a diode is connected between the output node of the circuit for generating the pulse signal $\phi_X$ and the $V_H$ node 194 in FIG. 13 so as to turn "on" the diode when the potential of the pulse $\phi_X$ is high relative to the voltage $V_H$ as described before.

As described above, according to the present invention, in a circuit which includes a bipolar transistor and an IGFET, the reference voltage of the operation thereof is set at a value different from that of the reference operating voltage of a preceding circuit for controlling the above circuit, so that the high driving capability of the bipolar transistor is sufficiently exploited, while at the same time a desired high output level can be attained.

Embodiment 6

Figure 15A:
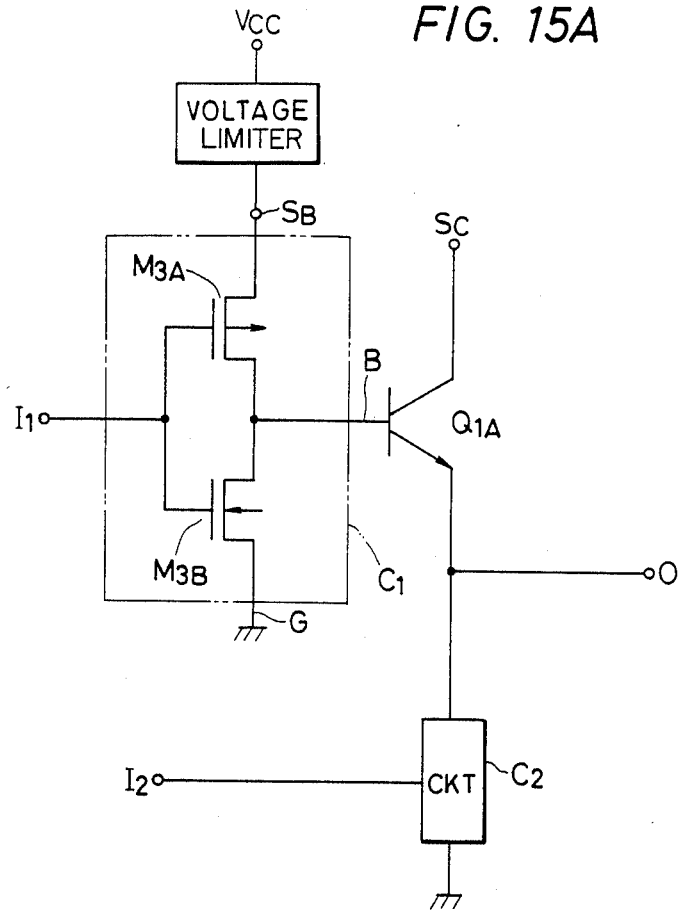

FIG. 15A shows a sixth embodiment of the present invention. In the figure, a bipolar transistor $Q_{1A}$ serves to charge an output node O. Symbol $C_1$ denotes a circuit for controlling the base current of the transistor $Q_{1A}$, and symbol $C_2$ a circuit for discharging the output node O. In addition, $I_1$ and $I_2$ indicate input nodes, and $S_B$ indicates a node from which the base current is supplied, while $S_C$ indicates a node from which the collector current of the bipolar transistor is supplied. The circuits $C_1$ and $C_2$ are designed so that the potentials of the input nodes $I_1$ and $I_2$ and the output node O may fall into a desired logic relationship as will be stated later. In this embodiment, the collector current of the bipolar transistor $Q_{1A}$ is fed from the node $S_C$, but the base current is fed from the node $S_B$. The base current of the bipolar transistor is $1/h_{fe}=1/10-1/100$ of the collector current, so that in charging the output node O in the above circuit, the current to be supplied from the node $S_B$ is approximately $1/(h_{fe}+1) \approx 1/h_{fe}$ of the total charging current to flow into the output node O. Accordingly, as a base current source which is connected to the node $S_B$, one of low driving capability can be used. The value of an "off" level in this embodiment becomes a value obtained by subtracting the base-emitter forward voltage $V_{BE}$ of the bipolar transistor $Q_{1A}$ from the potential of the base B of this bipolar transistor. In order to attain the desired "off" level, accordingly, the circuit $C_1$ and the base current source need to be designed so that, in charging the output node O, the potential of the base B may become higher than the desired "off" level by $V_{BE}$. Since, however, the driving capability required of the base current source is low as stated above, the value of the "off" level can be readily set at will and at high precision. By way of example, it can be readily set with the output of a voltage limiter which is provided in a chip. Besides, in order to prevent the bipolar transistor $Q_{1A}$ from getting saturated, the potential of the node $S_C$ needs to be held higher than that of the base B. In this regard, since the present embodiment can set the potential of the node $S_C$ independently of the setting of the "off" level, it can reliably prevent the saturation of the bipolar transistor $Q_{1A}$. In this manner, according to the present embodiment, with the saturation of the bipolar transistor prevented reliably, the value of the "off" level can be set at will and at high precision, so that the feature of high operating speed of the bipolar transistor can be satisfactorily exploited. In FIG. 15A, the input nodes $I_1$ and $I_2$ of the circuits $C_1$ and $C_2$, with one node for each circuit, are shown independently, but it is also allowed to furnish each circuit with a plurality of input nodes or both the circuits with a common input node as is necessary. Besides, various modifications such as connecting a ground node G to the output without being grounded are of course possible. To be added is that, although the sources of the base current and the collector current are not especially shown in FIG. 15A, they may be sources affording fixed potentials or impressing pulses according to purposes. These sources may be disposed either inside or outside the LSI chip including the circuit of the present embodiment. By way of example, the node $S_C$ is connected to a source voltage (for example, 5 V) which is fed from outside the LSI chip, and the node $S_B$ is connected to a circuit inside the chip, which generates a voltage (for example, 3.8 V) lower than the external source voltage with reference to this source voltage.

Figure 15B:
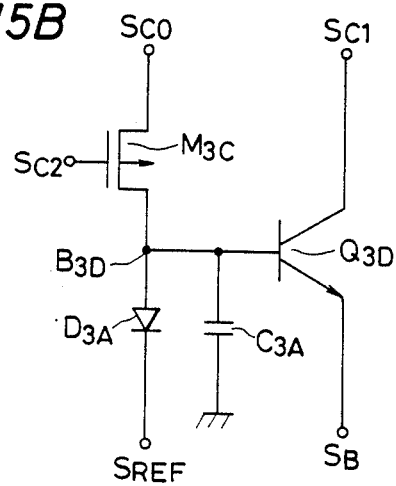

FIG. 15B shows an embodiment of a voltage limiter included in the arrangement of FIG. 15A. Here, the potential of the node $S_B$ becomes a value which is obtained by adding the forward base-emitter voltage $V_{BE}$ of a diode $D_{3A}$ to the potential of a node $S_{REF}$ and then subtracting the base-emitter voltage $V_{BE}$ of a bipolar transistor $Q_{3D}$. Accordingly, the potential of the node $S_B$ can be controlled with the potential of the node $S_{REF}$. Further, the potential of a node $S_{C1}$ may be set at a potential higher than that of the base $B_{3D}$ of the bipolar transistor $Q_{3D}$ so as to prevent this bipolar transistor from being saturated. Besides, the potentials of nodes $S_{C2}$ and $S_{C0}$ may be held so as to prevent a p-channel IGFET $M_{3C}$ from turning "off". By way of example, when an upper source voltage $V_{CC}$ is set at 5 V, the potentials of the nodes $S_{C0}$ and $S_{C1}$ are set at 5 V, the potential of the node $S_{C2}$ is set at 0 V and the potential of the node $S_{REF}$ is set at 3.8 V, the potential of the node $S_B$ becomes 3.8 V assuming the voltage $V_{BE}$ to be 0.8 V, and the "off" level of the circuit in FIG. 15A can be set at 3 V. According to the present embodiment, the bipolar transistor $Q_{3D}$ of high driving capability is employed, so that the node $S_B$ can be controlled to the fixed potential at high precision. A capacitor $C_{3A}$ serves to prevent the potential of the base $B_{3D}$ from fluctuating with increase or decrease in the base current of the bipolar transistor $Q_{3D}$.

Thus, the control of the "off" level can be readily performed without incurring the saturation of the bipolar transistor $Q_{1A}$ in FIG. 15A.

In the base current control circuit $C_1$ in FIG. 15A, a CMOS inverter circuit is constructed of a p-channel IGFET $M_{3A}$ and an n-channel IGFET $M_{3B}$. When the potential of the input node $I_1$ becomes a low level, the p-channel IGFET $M_{3A}$ turns "on" and the n-channel IGFET $M_{3B}$ turns "off", so that current flows from the node $S_B$ to the base B. When the potential of the input node $I_1$ becomes a high level, the IGFET $M_{3A}$ turns "off" and the IGFET $M_{3B}$ turns "on", so that the base current is interrupted, and the potential of the base B becomes 0 V. According to the present embodiment, the current flows from the node $S_B$ only when the input node $I_1$ has become the low level, and hence, the power consumption is kept low. Moreover, since the p-channel IGFET $M_{3A}$ and the n-channel IGFET $M_{3B}$ are for controlling the base current, they may be small in size, and an input capacitance as viewed from the input node $I_1$ can be made low.

Figure 16:
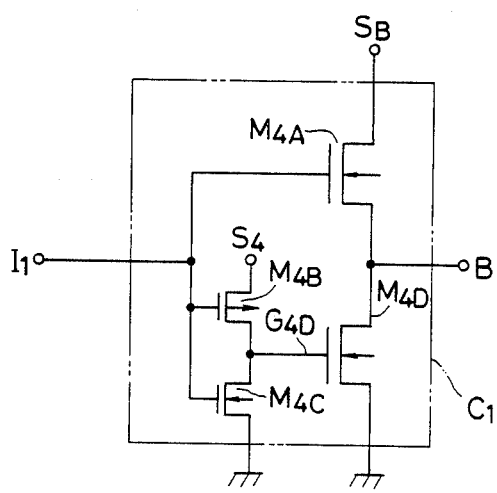
FIGS. 15A to 19 are diagrams for explaining a sixth embodiment of the present invention.

While the above embodiment is the circuit in which the base current flows when the input node $I_1$ is at the low level, a circuit in which a base current flows when an input node $I_1$ is at a high level can be readily realized. FIG. 16 shows such an embodiment. Referring to the figure, a circuit $C_1$ is constructed of four IGFETs, among which the p-channel IGFET $M_{4B}$ and the n-channel IGFET $M_{4C}$ constitute a CMOS inverter and function to invert a potential applied to the input node $I_1$ and to transfer the inverted potential to the gate $G_{4D}$ of the IGFET $M_{4D}$. When the potential of the input node $I_1$ becomes the high level, the n-channel IGFETs $M_{4A}$ and $M_{4C}$ turn "on". Since, at this time, the gate $G_{4D}$ of the n-channel IGFET $M_{4D}$ becomes 0 V, the n-channel IGFET $M_{4D}$ turns "off". Accordingly, current flows from a node $S_B$ to a base B. On the other hand, when the potential of the input node $I_1$ becomes the low level, the n-channel IGFETs $M_{4A}$ and $M_{4C}$ turn "off", and the p-channel IGFET $M_{4B}$ turns "on". As a result, the potential of the gate $G_{4D}$ rises up to the potential of a node $S_4$, and the n-channel IGFET $M_{4D}$ turns "on". Accordingly, the base current is cut off, and the potential of the base B becomes 0 V. As thus far described, according to the embodiment of FIG. 16, the base current can be caused to flow only when the input node $I_1$ has become the high level. The arrangement of FIG. 16 should desirably be so designed that the potential of the node $S_4$ is held at or below the high level of the node $I_1$, thereby to turn "off" the p-channel IGFET $M_{4B}$ when the node $I_1$ is at the high level. In the present embodiment, the potential of the base B to develop when the input node $I_1$ has become the high level can also be determined by the potential of the input node $I_1$. More specifically, letting $V_{T4A}$ denote the threshold voltage of the n-channel IGFET $M_{4A}$, $V_{I1H}$ denote the potential of the node $I_1$ at the high level, and $V_{SB}$ denote the potential of the node $S_B$, the potential of the base B rises up to $V_{SB}$ for $V_{I1H} \geq V_{SB} + V_{T4A}$, but it becomes $V_{I1H} - V_{T4A}$ for $V_{I1H} < V_{SB} + V_{T4A}$. At this time, accordingly, the potential of the output node O in FIG. 15A becomes $V_{I1H} - V_{T4A} - V_{BE}$, and the "off" level can also be determined by $V_{I1H}$.

Figure 17:
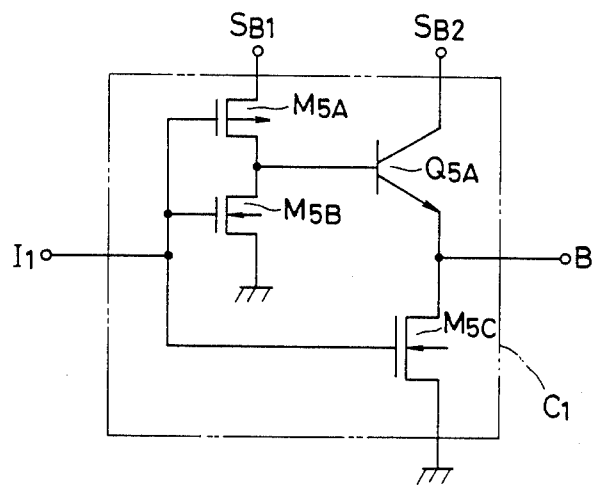

FIG. 17 shows an embodiment in which the circuit $C_1$ in FIG. 15A is constructed of MIS transistors and a bipolar transistor. This embodiment is a circuit in which, likewise to the embodiment of FIG. 15A, current is caused to flow to the base B when the input node $I_1$ is at the low level, and it is cut off when the input node $I_1$ is at the high level. The point of difference from FIG. 15A is that the p-channel MIS transistor $M_{3A}$ in FIG. 15A is replaced with the p-channel MIS transistor $M_{5A}$, the n-channel MIS transistor $M_{5B}$ and the bipolar transistor $Q_{5A}$. According to the present embodiment, the bipolar transistor $Q_{5A}$ is Darlington-connected with the bipolar transistor $Q_{1A}$ in FIG. 15A, so that a very fast operation can be expected. The "off" level in the present embodiment becomes a value which is obtained by subtracting the forward base-emitter voltages of the bipolar transistors $Q_{5A}$ and $Q_{1A}$ from the potential of a node $S_{B1}$. Since current to flow from the node $S_{B1}$ becomes about $1/(h_{fe})^2$ of current to flow to the output node O in FIG. 15A, the driving capability of a source for supplying current to the node $S_{B1}$ may be very low. In the present embodiment, the potential of a node $S_{B2}$ may be held at a potential at which the bipolar transistor $Q_{5A}$ does not get saturated.

Figure 18:
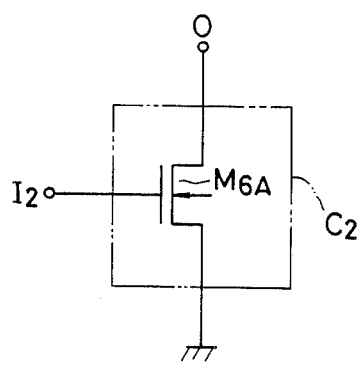

While, in the above, the embodiment for the circuit $C_1$ in FIG. 15A has been stated, embodiments for the circuit $C_2$ will be described below. FIG. 18 shows an example in which the circuit $C_2$ is constructed of a single n-channel MIS transistor $M_{6A}$. When the input $I_2$ is at the low level, the MIS transistor $M_{6A}$ turns "off", and when the former is at the high level, the latter turns "on". With a measure in which the high level is established when the bipolar transistor $Q_{1A}$ turns "on", no excess current flows from the node $S_C$ to the ground. By way of example, when the embodiment in FIG. 15A or FIG. 17 is employed as the circuit $C_1$, in phase signals may be applied to the input nodes $I_1$ and $I_2$, and these nodes $I_1$ and $I_2$ can also be connected at that time. In case of employing the embodiment in FIG. 16 as the circuit $C_1$, antiphase signals may be applied to the input nodes $I_1$ and $I_2$. According to the embodiment in FIG. 18, when the input node $I_2$ becomes the high level, the potential of the output node O lowers down to 0 V, and the n-channel MIS transistor $M_{6A}$ is thereafter held "on", so that the output node O can be maintained at a low impedance.

Figure 19:
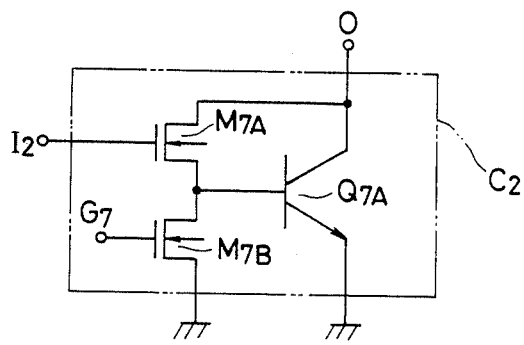

FIG. 19 shows an embodiment in which the circuit $C_2$ is constructed including a bipolar transistor. The gate $G_7$ of an n-channel MIS transistor $M_{7B}$ in FIG. 19 is connected to the base B of the bipolar transistor $Q_{1A}$ or the output node O in FIG. 15A. In the present embodiment, when the input node $I_2$ becomes the high level, the bipolar transistor $Q_{7A}$ turns "on", and the potential of the output node O can be lowered fast. When the bipolar transistor $Q_{1A}$ in FIG. 15A turns "on" for the low level of the input node $I_2$, the base B and the output node O become the high level. Then, the n-channel MIS transistor $M_{7B}$ in FIG. 19 turns "on" to bring the base of the bipolar transistor $Q_{7A}$ to 0 V and to turn "off" this bipolar transistor. With the present embodiment, when the potential of the output node O lowers down to the forward base-emitter voltage of the bipolar transistor $Q_{7A}$, this transistor $Q_{7A}$ turns "off", and the potential of the output node O cannot be rendered perfectly 0 V. In a case where the above potential needs to be rendered 0 V, the embodiment in FIG. 18 may be jointly used.

According to Embodiment 6, in a driving circuit which is constructed including a bipolar transistor, a source for supplying the base current of the bipolar transistor and a source for supplying the collector current are isolated, so that a base potential and a collector potential can be controlled independently, whereby an "off" level can be set at will and at high precision with the saturation of the bipolar transistor prevented.

Embodiment 7

Next, a seventh embodiment of the present invention will be described in detail with reference to FIG. 20.

Letter C indicates an input node from a preceding circuit, and letter D an output node. With the circuit of the embodiment, an output of large amplitude D is obtained from an input of small amplitude C. Symbols $B_1$, $B_2$ and $B_3$ denote nodes for applying high D.C. or pulse voltages. The node $B_1$ of them supplies the high voltage to a node F through a switch 12, the node $B_2$ supplies the high voltage to the source of a p-MOSFET 13, and the node $B_3$ supplies the high voltage to the collector of a bipolar transistor 15. These nodes $B_1$, $B_2$ and $B_3$ may be isolated, but two or all of them may well be connected. Letter A indicates the control node of switching means 11. The output voltage is raised by the bipolar transistor 15, and it is lowered by a circuit block 16. The p-MOS transistor 13 and an n-MOS transistor 14 serve to control the bipolar transistor 15. The number of inputs can be freely altered by increasing or decreasing the number of the switches 11 in FIG. 20. In FIG. 20 and embodiments to be described later, the high voltage side of the input of small amplitude C or the control input A shall be written $V_A$, while the high voltage side of the D.C. voltage or pulse to be applied to the nodes $B_1$, $B_2$ and $B_3$ shall be written $V_H$. Although the voltages of these nodes need not always agree perfectly with $V_A$ or $V_H$, the lower voltage system shall be indicated by $V_A$ and the higher voltage system by $V_H$ in order to simplify the description.

Figure 21:
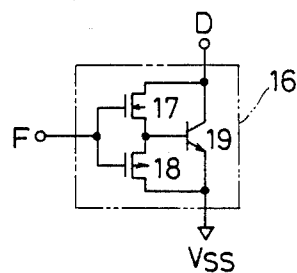
Figure 22:
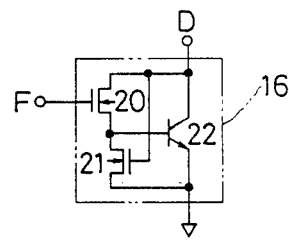

Now, the operation of the embodiment in FIG. 20 will be described. First, when the input node C becomes a low potential with the switch 11 in its "on" state and the switch 12 in its "off" state, the node F becomes the low potential to turn "on" the p-MOSFET 13 and "off" the n-MOSFET 14. As a result, the base potential G of the bipolar transistor 15 becomes $V_H$, and the output is raised to the high potential $V_H - V_{BE}$ at high speed by the bipolar transistor 15. Here, $V_{BE}$ denotes the base-emitter voltage of the bipolar transistor 15. Next, when the input C becomes a high potential, the potential of the node F rises through the switch 11 and becomes $V_A - V_{T11n}$. Here, $V_{T11n}$ denotes the threshold voltage of an n-MOSFET which constructs the switch 11. As a result, the transistor 14 turns "on", the transistor 15 turns "off" and the transistor 16 turns "on", so that the output potential of the node D is lowered. Substantially simultaneously with the change-over of the input C to the high potential, the switch 12 is turned "on" to bring the potential of the node F to $V_H$ higher than $V_A - V_{T11n}$. Thus, a through current to flow through the FETs 13 and 14 can be prevented. When the node F becomes higher in potential than the nodes C and A, the switch 11 turns "off" automatically, and the potential of the node F rises independently of the input. The means 16 for lowering the output potential may be constructed of a single n-MOS transistor as shown in FIG. 20. However, when a hybrid circuit of bipolar and MOS transistors as shown in FIG. 21 or FIG. 22 is employed in this portion, the output can be raised still faster. Furthermore, when the n-MOS transistor shown at numeral 16 in FIG. 20 and either of the circuits in FIGS. 21 and 22 are connected in parallel, the output potential can be lowered down to 0 V at high speed.

Figure 20:
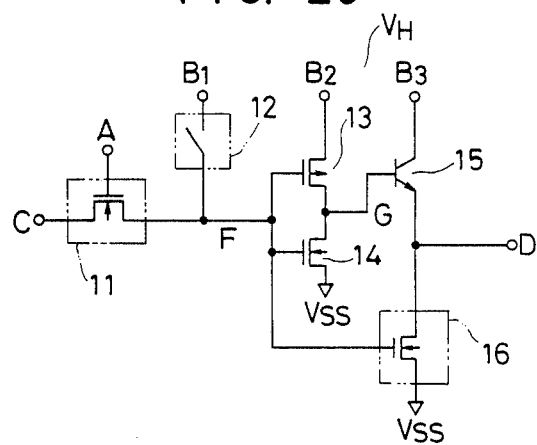
FIGS. 20 to 26 are diagrams for explaining a seventh embodiment of the present invention.
Figure 23:
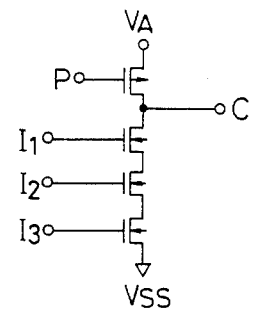
Figure 24:
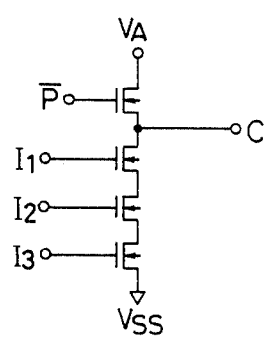
Figure 25:
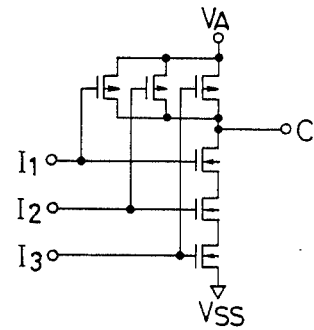
Figure 26:
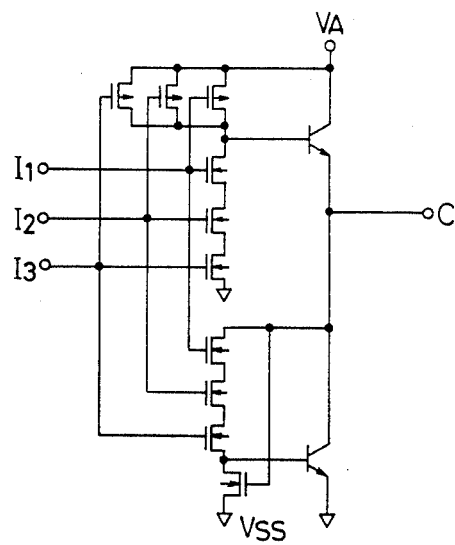

Examples of the arrangement of the preceding circuit which is connected to the input C in FIG. 20 are shown in FIGS. 23, 24, 25 and 26. FIG. 26 shows a bipolar-/CMOS hybrid gate circuit. All the examples have a 3-input NAND function. Since the reference voltage is as low as $V_A$, also the output voltage C becomes $V_A$ or lower. In FIG. 23 or FIG. 24, the node C is precharged to the high potential by a voltage P or $\overline{P}$ beforehand, and it is discharged when all inputs $I_1$, $I_2$ and $I_3$ are at the high potential. In FIG. 25 or FIG. 26, there is no dedicated precharge signal, but one or all of inputs $I_1$, $I_2$ and $I_3$ is/are brought to the low potential beforehand so as to precharge the node C to the high potential. When the circuit of FIG. 24 or FIG. 26 is employed as the preceding circuit in FIG. 20, the switch 11 can be omitted. The reason is that, in FIG. 24 or FIG. 26, n-MOS or bipolar transistors are connected to the output, so problems such as latch-up do not arise even when the node C is boosted to a voltage higher than $V_A$ by the operation of the succeeding circuit.

Embodiment 8

Figure 27:
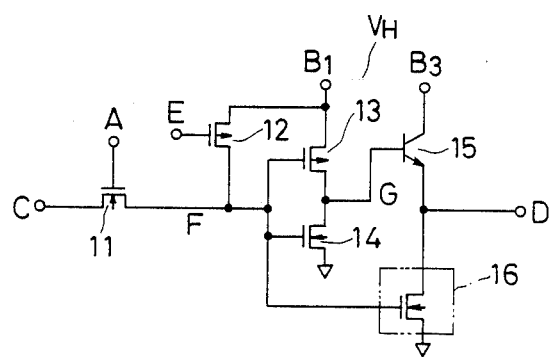
FIGS. 27 to 29 are diagrams for explaining an eighth embodiment of the present invention.

Next, an eighth embodiment is shown in FIG. 27. Unlike the embodiment of FIG. 20, this embodiment forms a switch 12 by the use of a p-MOS transistor, the source of which is connected with the source of a p-MOS transistor 13 into a node $B_1$.

Figure 28:
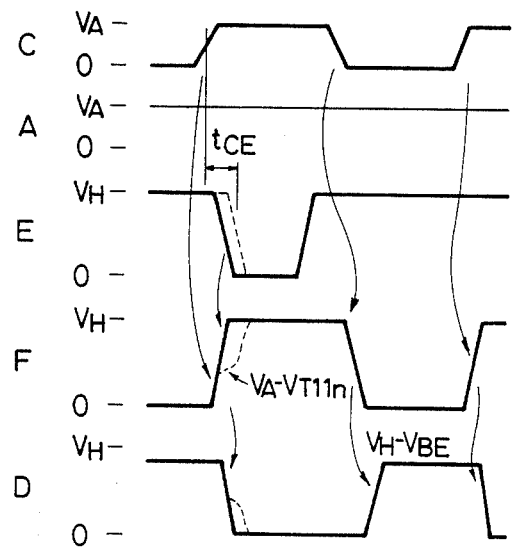
Figure 29:
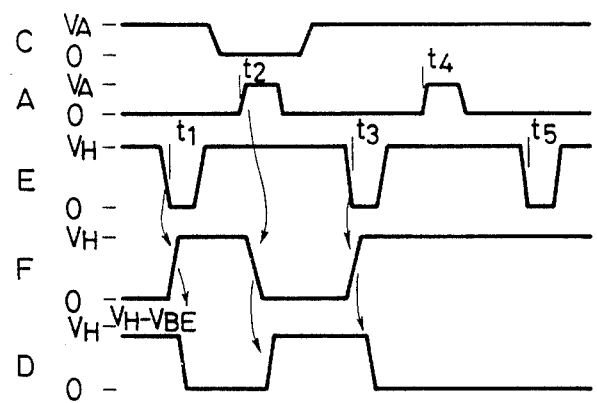

Now, the operation of this circuit will be described with reference to voltage waveform diagrams in FIGS. 28 and 29. FIG. 28 corresponds to a case where the node of the gate A of an n-MOS transistor 11 is at a high potential $V_A$ at all times. The high potential side of an input C is also assumed $V_A$. When the input C becomes the high potential with a node E being at the high potential, the potential of a node F becomes a value $V_a - V_{T11n}$ through the n-MOS transistor 11. Subsequently, when the node E becomes a low potential, the transistor 12 (p-MOS) turns "on", and the potential of the node F becomes $V_H$. As a result, the transistor 13 (p-MOS) turns "off", a transistor 14 (n-MOS) turns "on", a bipolar transistor 15 turns "off" and a transistor 16 (n-MOS) turns "on", so that an output D becomes a low potential. When the node F rises to a high potential $V_H$, the potentials of the nodes A and C are $V_A$, so that the transistor 11 turns "off", and the potential of the point C remains $V_A$. On the other hand, when the input C becomes the low potential with the node E being at the high potential, the transistor 11 turns "on", and the node F becomes the same low potential as that of the node C. As a result, the transistor 13 turns "on", the transistor 14 turns "off", a node G becomes $V_H$, and the output D is charged to a high potential at high speed. The high potential of this output is $V_H - V_{BE}$. In this circuit, as illustrated by broken lines in FIG. 28, when the period of time $t_{CE}$ taken since the node C has become the high potential $V_A$ until the node E becomes the low potential is long, the high potential of the node F remains at $V_A - V_{T11n}$ for a while, so that a through current flows through the transistors 13 and 14, and the period of time during which the node D remains at an insufficient low potential exists. Accordingly, with the system in which the node A is always at the high potential, it is desirable to shorten the period of time $t_{CE}$. To this end, the node E may be switched to the low potential at the same time that the node C becomes the high potential. Thus, the above problem can be perfectly solved. FIG. 29 shows another example of drive which prevents the aforementioned through current from flowing. It is a system wherein, in the circuit of FIG. 27, the node A is driven with a pulse. At times $t_1$ and $t_3$, the control node A is brought to the low potential before the node E changes-over to the low potential. At this time, the potential of the node C may be either high or low. When the node E becomes the low potential, the node F becomes the high potential $V_H$, but the n-MOS transistor 11 remains "off" because the node A is at the low potential. As a result, the output D becomes the low potential as in the foregoing. Subsequently, when the node A becomes a high potential at a time $t_2$ at which the node E reverts to the high potential and the input C is at the low potential, the node F becomes the low potential, with the result that the output D is charged to the high potential $V_H - V_{BE}$. To the contrary, when the input C is at the high potential as at a time $t_4$, the transistor 11 remains "off" and the output D remains at 0 V. Besides, even when the switch 12 is thereafter turned "on" at a time $t_5$, the node F remains at $V_H$ and the output D remains at 0 V. In this manner, with the system of FIG. 29, the potential of the node F is rendered the high potential $V_H$ through only the switch 12, and hence, the period of time during which the the potential of the node F becomes $V_A - V_{T11n}$ as indicated by the broken line in FIG. 28 is not existent.

Owing to the operation of this circuit, the large amplitude output D can be obtained from the small amplitude signal inputs at the nodes C and A.

Embodiment 9

Figure 30:
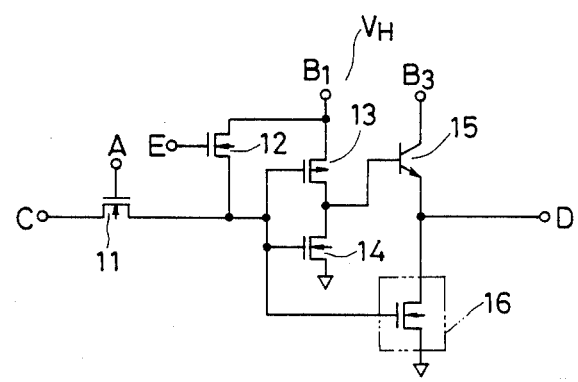
FIG. 30 is a diagram for explaining a ninth embodiment of the present invention.

While the switch 12 has been constructed of the p-MOS transistor in Embodiment 8 of FIG. 27, it can also be constructed of an n-MOS transistor as shown in Embodiment 9 of FIG. 30. On this occasion, the phase of the control signal E needs to be inverted to those in FIGS. 28 and 29. Further, in this case, the high potential of the node E needs to be set at $V_H + V_{T12n}$ or above in order to bring the high potential of the node F to $V_H$. Here, $V_{T12n}$ denotes the thereshold voltage of the transistor 12 (n-MOS).

The above is a system wherein the node A (switch 11) and the node E (switch 12) are synchronized, that is, a system wherein the switch 11 is turned "off" before the switch 12 is turned "on" and wherein the switch 12 is turned "off" before the switch 11 is turned "on". Next, there will be explained a system wherein the node E is made common with the node G.

Embodiment 10

Figure 31:
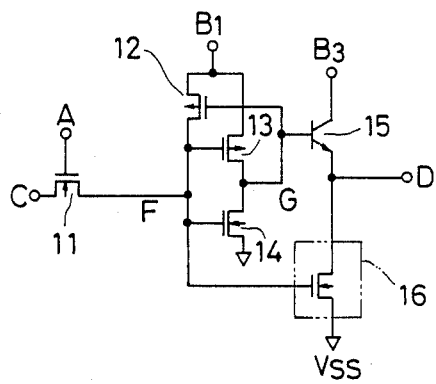
FIGS. 31 and 32 are diagrams for explaining a tenth embodiment of the present invention.

An embodiment in FIG. 31 is such that the switch 12 is constructed of a p-MOS transistor and is controlled with the output G of the succeeding CMOS transistor, thereby to dispense with the control signal E in embodiments 8 and 9. The operation of the circuit in FIG. 31 will be described with reference to a voltage waveform diagram in FIG. 32. First, when the input C becomes the low potential 0 V under the state under which the control input A of the switch 11 is the high potential $V_A$, also the node F becomes 0 V because the switch 11 is "on", so that the switch 13 turns "on" and the switch 14 turns "off". Thus, the potential of the node G becomes $V_H$, the bipolar transistor 15 turns "on" and the MOS transistor 16 turns "off". The output D rises fast owing to the bipolar transistor 15, and the output potential finally becomes $V_H - V_{BE}$. Since the potential of the node G is $V_H$, the switch 12 (p-MOS) changes from "on" to "off". Subsequently, when the input C becomes the high potential, the potential of the node F rises up to the potential $V_A - V_{T11n}$ through the transistor 11 (n-MOS). As a result, the transistor 14 turns "on", the transistor 13 turns almost "off", and the potential of the node G lowers to turn "on" the transistor 12. Consequently, the potential of the node F rises more and the potential of the node G lowers more until the node F finally becomes $V_H$ and the node G 0 V. In the course in which the potential of the node F rises from $V_A - V_{T11n}$ to $V_H$, the switch 11 automatically turns "off", and hence, the potential of the input C is constant. In this manner, positive feedback is applied by the switches 12, 13 and 14.

Figure 32:
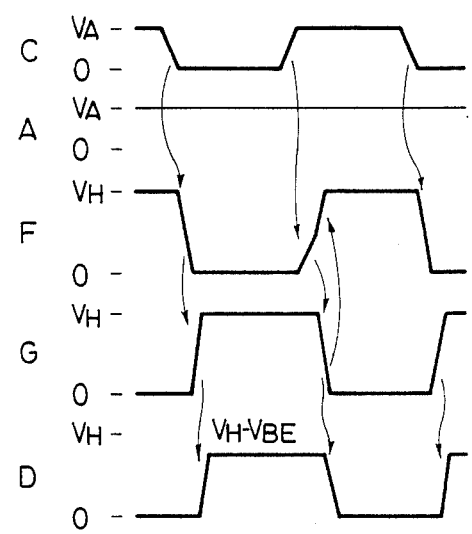

In FIG. 32, the control input A of the switch 11 has been normally held at the high potential. In case of impressing a pulse voltage on the control input A, however, when the input A is at the high potential, the output D can be changed according to the input C as described above, and when the input A is at the low potential, the output D can be held in the previous fixed state of the high potential or low potential irrespective of the change of the input C.

According to Embodiment 10 stated above, it becomes possible to obtain the output D of large amplitude from the input C of small amplitude without requiring any external surplus pulse signal.

Embodiment 11

Figure 33:
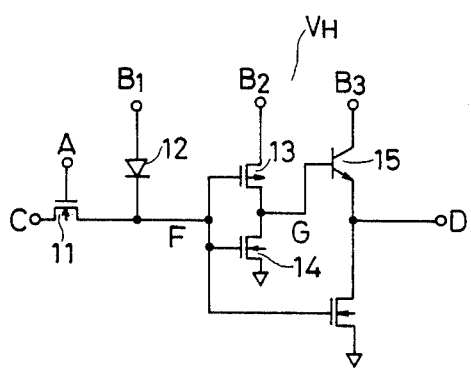
FIGS. 33 and 34 are diagrams for explaining an eleventh embodiment of the present invention.
Figure 34:
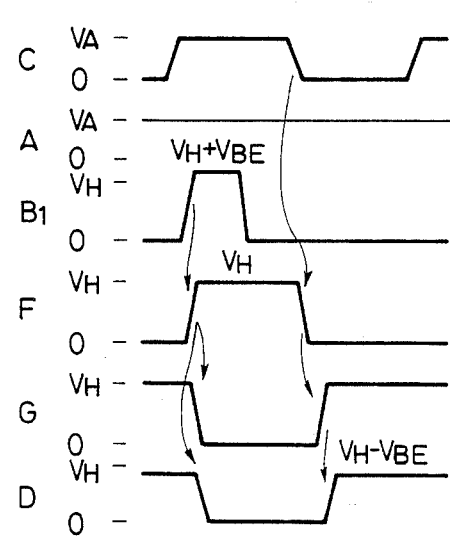

In the embodiments of FIGS. 27, 30 and 31 thus far described, the switch 12 has been constructed of the MOS transistor. Further, it is an embodiment in FIG. 33 that constructs the switch 12 out of a diode (bipolar or MOS diode), and not from a MOS transistor. FIG. 34 is a voltage waveform diagram of the embodiment. The system of FIG. 34 normally holds the gate of the n-MOS transistor of the switch 11 at the high potential $V_A$, and corresponds to the foregoing system of the electric waveform diagrams in FIGS. 38 and 32. Of course, an operation similar to that of FIG. 29 can be performed by impressing the pulse on the gate of the switch 11. Referring to FIG. 34, immediately after the input C has become the high potential $V_A$, the anode side $B_1$ of the diode 12 is supplied with a signal rising up to a potential $V_H + V_{BE}$, to charge the point F to $V_H$ through the diode 12. Thus, the output D is rendered 0 V. When the node $B_1$ reverts to 0 V, the diode 12 is reverse-biased and is turned "off". Thereafter, when the input C becomes the low potential, the potential of the point F becomes 0 V through the switch 11, and the output D is charged up to $V_H + V_{BE}$. When the input C remains at the high potential $V_A$ with the potential of the point F being $V_H$, the point F is not discharged, and the output D remains at 0 V. With the embodiment stated above, a large amplitude output can be obtained as in the preceding embodiments.

Embodiment 12

Figure 35:
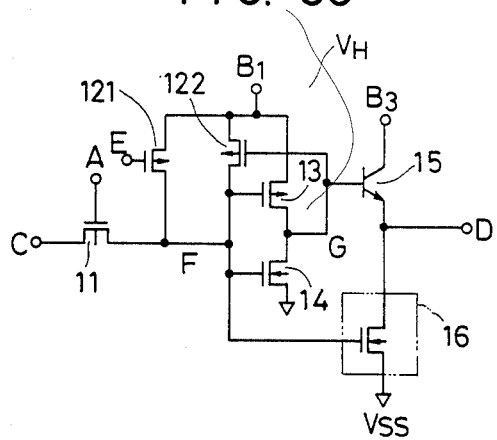
FIG. 35 is a diagram for explaining a twelfth embodiment of the present invention.

Further, it is an embodiment in FIG. 35 that employs the system of FIG. 31 jointly with the system wherein the switch 12 is controlled with the control signal E as in FIG. 27 described before. In FIG. 35, a transistor 121 (p-MOS) is a switch which sets the node F at the high potential $V_H$ by the use of the external control signal E, while a transistor 122 (p-MOS) is a switch which sets the node F at the high potential $V_H$ in such a way that the output G of a CMOS inverter constructed of the transistors 13 and 14 is used as a control signal. This circuit operates similarly to the circuit of FIG. 27, but as compared with the latter, the former has the advantage that both the stabilization and raised speed of the circuit operation can be attained by adjusting the gate widths of the p-MOS transistors 121 and 122. More specifically, when the switches 11 and 121 are "off", the switch 122 turns "on" to prevent the point F from falling into the floating state. Therefore, noise does not enter the point F from outside, and it is possible to stably hold the point F at the high potential and the output D at the low potential. Besides, when the point F is to be charged from the low potential to the high potential, the switch 121 is turned "on", so that the potential of the point F can be raised fast while the output D can be lowered fast by rendering the gate width of the switch 121 large. On the other hand, the potential of the point F can be lowered fast while the output D can be raised fast by rendering the gate width of the switch 122 small. In this way, both the rise and fall of the output D can be made high in speed.

Embodiment 13

Figure 36:
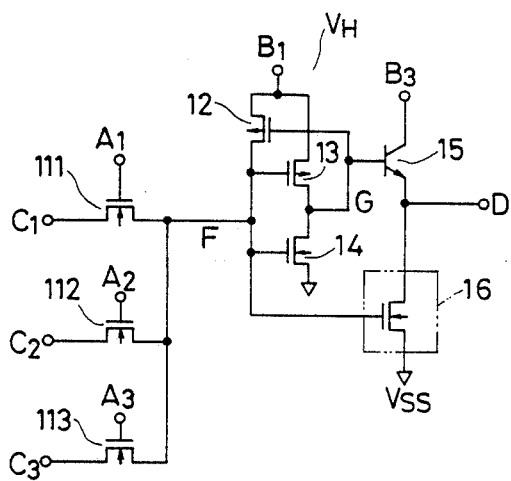
FIG. 36 is a diagram for explaining a thirteenth embodiment of the present invention.

Any of the embodiments thus far described corresponds to the case of one input (C) and one output (D), but a case of many inputs can also be constructed by connecting a large number of switches 11 in parallel in conformity with the number of the inputs. By way of example, an embodiment in which the arrangement of FIG. 31 is modified to have 3 inputs is shown in FIG. 36. In FIG. 36, the 3 inputs ($C_1$, $C_2$, $C_3$) and signals $A_1$, $A_2$ and $A_3$ for controlling them are respectively applied to switches 111, 112 and 113. With the present circuit, any of the inputs $C_1$–$C_3$ of the switches whose signals $A_i$ (i=1, 2, 3) are at the high potential $V_A$ is fed in, and an output corresponding thereto is provided from the output node D. Besides, when all the signals $A_1$, $A_2$ and $A_3$ are at the low potential, the output D and the potentials of the nodes F and G can keep previous states and continue to hold fixed potentials irrespective of the change of any of the inputs $C_1$, $C_2$ and $C_3$.

Embodiment 14

Figure 37:
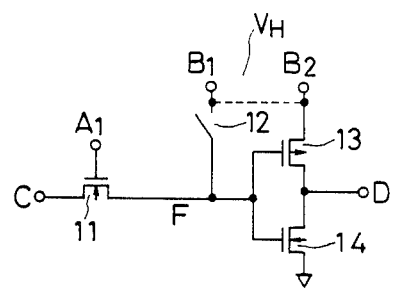
FIGS. 37 and 38 are diagrams for explaining a fourteenth embodiment of the present invention.
Figure 38:
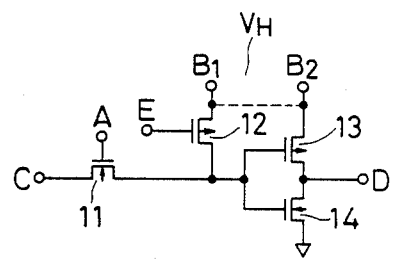

In any of the foregoing embodiments, the bipolar transistor has been employed at the output in order to raise the output level fast, but it is sometimes possible to remove the bipolar transistor and to derive an output from the point G of each embodiment. In this case, the operating speed is inferior as the bipolar transistor is not used, but an output of large amplitude can be obtained from an input of small amplitude. Next, such arrangements will be explained. FIG. 37 and FIG. 38 show these embodiments. FIG. 37 of them corresponds to FIG. 20, and FIG. 38 corresponds to FIG. 27. In both the embodiments, the output charging bipolar transistor 15 and the discharging n-MOS transistor 16 in FIGS. 20 and 27 are omitted. The operations and voltage waveforms of the circuits are as have already stated. With these circuits, the rise of the output becomes slow because of the absence of the bipolar transistor, whereas there is the advantage that the potential $V_H$ of the node $B_2$ is provided at the output D through the p-MOS transistor 13 as it is, in other words, without the voltage drop $V_{BE}$. It is the same as in the preceding embodiments that, in FIGS. 37 and 38, the nodes $B_1$ and $B_2$ may be connected as indicated by broken lines and supplied with the identical voltage $V_H$ though they may well be isolated.

Embodiment 15

Hereinafter will be explained embodiments in which the present invention is applied to the word drivers of a semiconductor storage device (hereinbelow, simply termed "memory").

Figure 39:
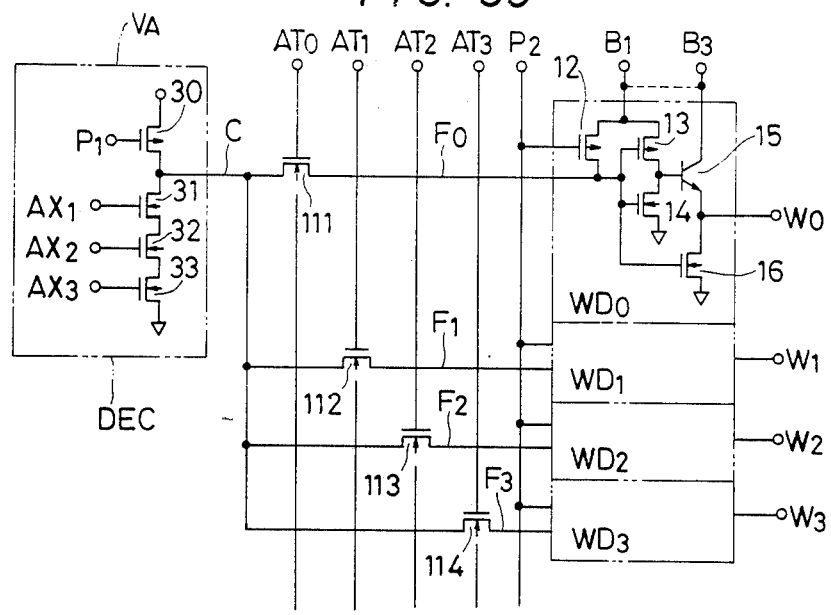
FIGS. 39 and 40 are diagrams for explaining a fifteenth embodiment of the present invention.
Figure 40:
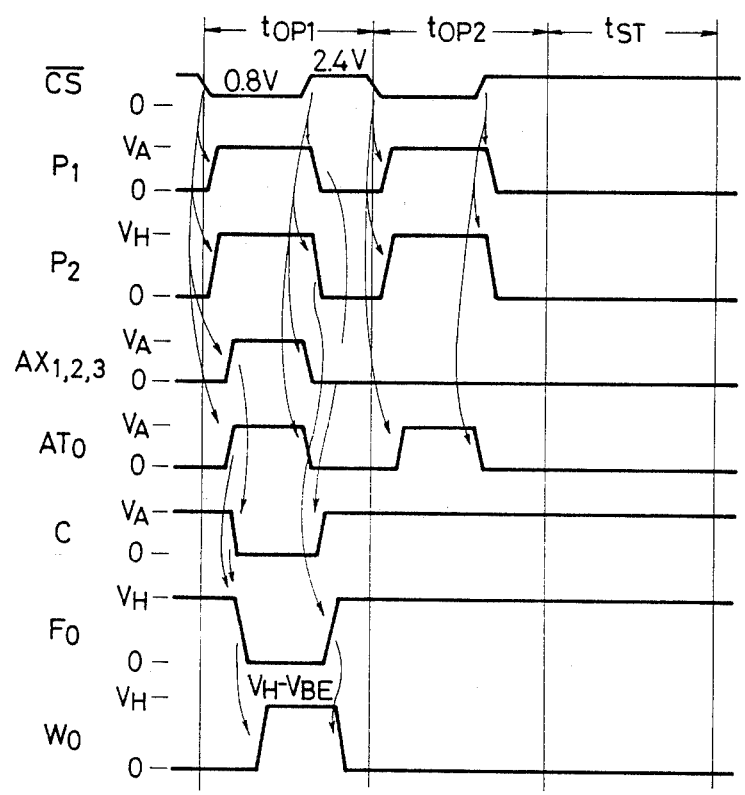

FIG. 39 shows one embodiment of a decoder as well as word drivers. Symbol DEC denotes the decoder circuit, and symbols $WD_0$, $WD_1$, $WD_2$ and $WD_3$ denote the word drivers. The circuit of the embodiment in FIG. 27 is employed for the word driver. In this circuit arrangement, the output C of the single decoder circuit is shared by the four word drivers. Switches 111, 112, 113 and 114 constructed of n-MOS transistors are interposed between the decoder and the word drivers, and they are respectively controlled by signals $AT_0$, $AT_1$, $AT_2$ and $AT_3$. $P_1$ and $P_2$ indicate precharge signals for the decoder and the word drivers respectively, and in the standby mode or precharge period of the memory, the point C is charged to $V_A$ and points $F_0$, $F_1$, $F_2$ and $F_3$ are charged to $V_H$. Signals $AX_1$, $AX_2$ and $AX_3$ and the signals $AT_0$, $AT_1$, $AT_2$ and $AT_3$ are the outputs of an address buffer and a predecoder respectively. When all the signals $AX_1$, $AX_2$ and $AX_3$ are of high potential, the point C falls into a selected state of low potential. Further, when one of the lines $AT_0$, $AT_1$, $AT_2$ and $AT_3$ becomes the high potential, the word driver output connected thereto is charged into a selected state of high potential. Next, operations in FIG. 39 will be described with reference to a voltage waveform diagram in FIG. 40. A signal $\overline{CS}$ in FIG. 40 corresponds to the signal $\overline{CS}$ in FIG. 10A, and is a basic input signal for the timing control of a memory chip. Here, the input voltage of a TTL interface is supposed. It is assumed that the high potential of the signal $\overline{CS}$ is the standby mode or the precharge period, while the memory changes into an operating state in the period of the low potential thereof. First, a cycle $t_{op1}$ in FIG. 40 will be explained. When the signal $\overline{CS}$ is at the high potential, the signals $P_1$ and $P_2$ are 0 V, and the point C and the points $F_0$, $F_1$, $F_2$ and $F_3$ are respectively charged to the high potential $V_A$ and the high potential $V_H$ by p-MOS transistors 30 and 12 beforehand. At this time, all word lines $W_0$, $W_1$, $W_2$ and $W_3$ are at a low potential 0 V. When the memory falls into the operating state with the signal $\overline{CS}$ being at the low potential, the signal $P_1$ becomes the high potential $V_A$ and the signal $P_2$ the high potential $V_H$, so that both the p-MOS transistors 30 and 12 are turned "off". At this time, when all the signals $AX_1$, $AX_2$ and $AX_3$ become the high potential $V_A$, the point C becomes 0 V. Further, when only the signal $AT_0$ is at the high potential $V_A$ and the other signals $AT_1$, $AT_2$ and $AT_3$ are at the low potential 0 V, only the point $F_0$ becomes 0 V and the points $F_1$, $F_2$ and $F_3$ remain at the high potential $V_H$. As a result, the word line $W_0$ is charged to a high potential $V_H - V_{BE}$, and the word lines $W_1$, $W_2$ and $W_3$ remain at the low potential 0 V. After the end of the reading and rewriting of the memory, all the signals AX and AT become the low potential in accordance with the input $\overline{CS}$ and also the signals $P_1$ and $P_2$ become the low potential, to charge the points C, $F_0$, $F_1$, $F_2$ and $F_3$ to the high potentials again. As a result, the selected word line $W_0$ reverts to 0 V. In the next cycle $t_{op2}$, it is assumed that address inputs change and that at least one of the signals $AX_1$, $AX_2$ and $AX_3$ remain at the low potential. On this occasion, even when the signal $AT_0$, for example, becomes $V_A$ with the decoder output C remaining at $V_A$, the point $F_0$ is not discharged, and hence, the output $W_0$ remains at 0 V. Since, in the standby mode $t_{ST}$, the $\overline{CS}$ input is the high potential, the signals $P_1$ and $P_2$ remain at the low potential and the signals AX and AT remain at the low potential. At this time, all the word outputs hold the low potential. The decoder DEC in FIG. 39 is a 3-input NAND circuit equivalent to that in FIG. 23, but the circuits as shown in FIGS. 24, 25 and 26 can also be employed. Besides, it is readily possible to set the number of inputs of the decoder at any number other than three or to share the output of one decoder by word drivers in a number other than four.

Embodiment 16

Figure 41:
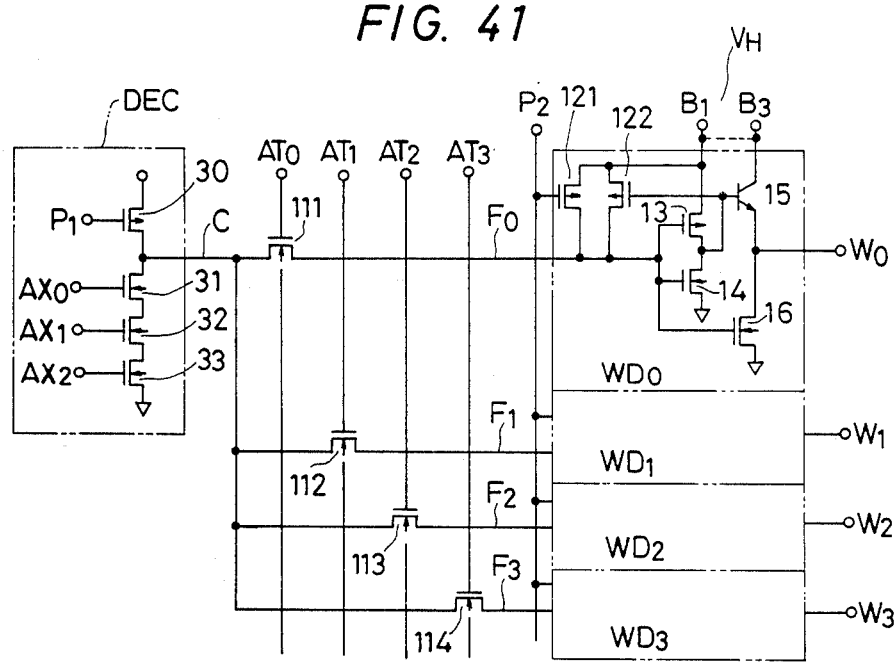
FIG. 41 is a diagram for explaining a sixteenth embodiment of the present invention.

FIG. 41 shows an embodiment in which the circuit of FIG. 35 is employed for the word driver. While the controls of the decoder and the word drivers can be performed similarly to the case of FIG. 40, these word drivers can attain both the stabilization and raised speed of the operation as stated in conjunction with FIG. 35. More specifically, when the signal $P_2$ is at the high potential and the decoder output C is at the high potential, or when the signal $P_2$ is at the high potential and the switches 111–114 are "off", the potentials of the points $F_0$–$F_3$ can be stably held at $V_H$ by the operation of the switch 122. Accordingly, even when a certain word changes-over from the low potential to the high potential, noise is difficult to be induced at the points $F_0$–$F_3$ of the word drivers of the other words, and the unselected words can be stably held at the low potential. Besides, the responses of the points $F_0$–$F_3$ can be rendered fast by adjusting the gate widths of the switches 121 and 122.

Embodiment 17

Figure 42:
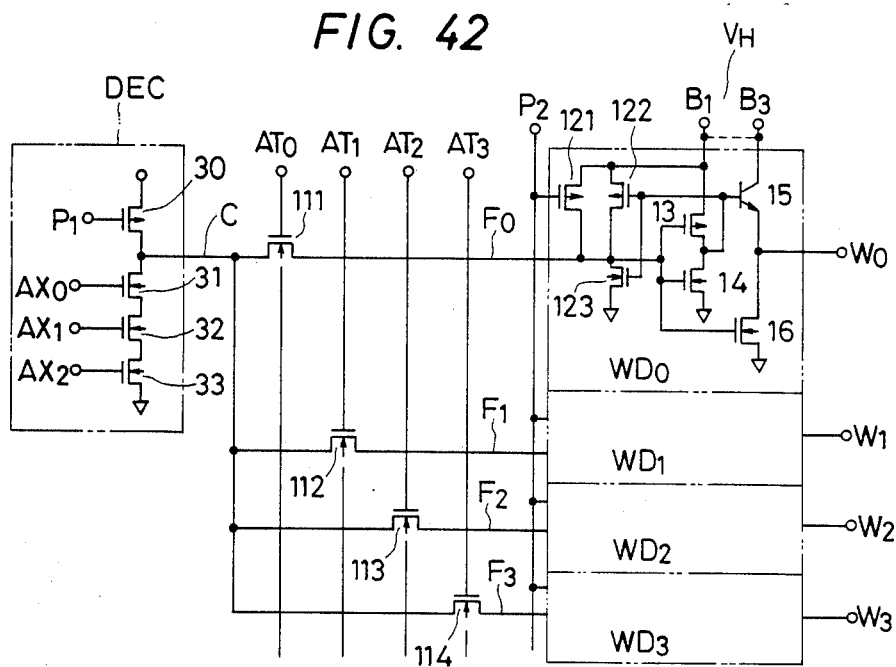
FIG. 42 is a diagram for explaining a seventeenth embodiment of the present invention.

FIG. 42 shows an embodiment which stabilizes the operation of the word driver more and which when compared with the embodiment of FIG. 41, has an n-MOS transistor 123 added. With this circuit, when the signal $P_2$ is "off" and one or more of the switches 111–114 is/are "off", the corresponding node or nodes $F_0$–$F_3$ can be stably held at the high potential $V_H$. Moreover, any of the nodes $F_0$–$F_3$ can be stably held at 0 V for the following reason. In order to select a certain word line, for example, $W_0$, the decoder output C is put to the low potential, and the switch 111 is turned "on", thereby to discharge the node $F_0$ to the low potential and to bring the output $W_0$ into the selected state of the high potential (potential $V_H - V_{BE}$). Thereafter, even when any of the MOS transistors 31–33 and 111 turns "off" according to the situation of the preceding circuit, the operation of the transistor 123 can hold the node $F_0$ at the low potential (0 V) and the word output $W_0$ at the high potential. It is the same as in the embodiments of FIGS. 23–25 that, in order to subsequently bring the word line into the unselected state, the signal $P_2$ may be rendered the low potential while the point $F_0$ may be inverted into the high potential. In this manner, the present embodiment of FIG. 42 can stably hold the potentials of the nodes $F_0$–$F_3$ at the high potential or the low potential even when the switches 111–114 and 121 have changed into the "off" states. Accordingly, the periods of time during which the inputs $AX_0$–$AX_2$ and $AT_0$–$AT_3$ from the preceding circuits are at the high potential can be set independently of the selection periods of time of the word lines, so that the timing controls of the preceding circuits are facilitated.

Embodiment 18

Figure 43:
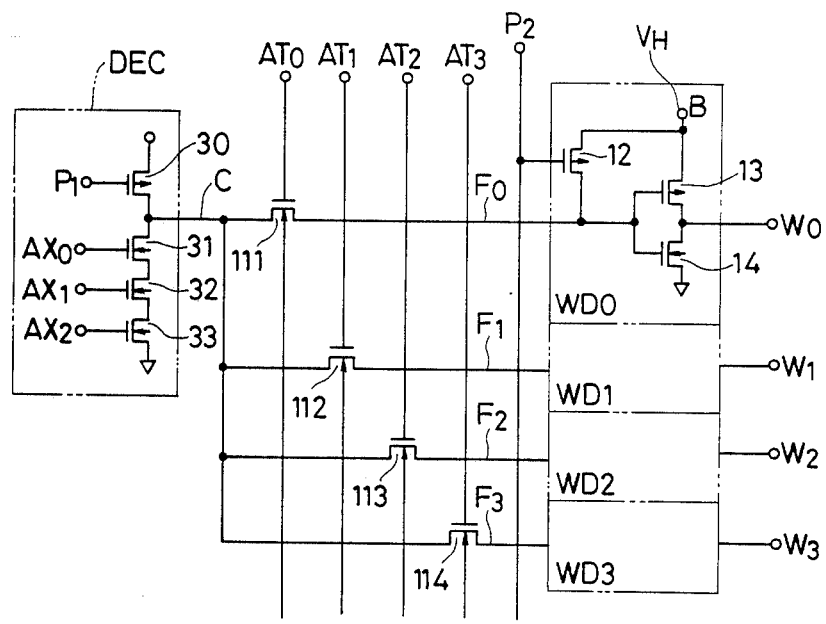
FIG. 43 is a diagram for explaining an eighteenth embodiment of the present invention.

Further, FIG. 43 shows an arrangement in which the embodiment of the word driver in FIG. 37 is applied to the embodiment in FIG. 39. Since no bipolar transistor is required, the cost of production can be lowered. The circuit operation is almost equal to that of the embodiment in FIG. 39, and shall be omitted from the description.

Embodiment 19

Figure 44:
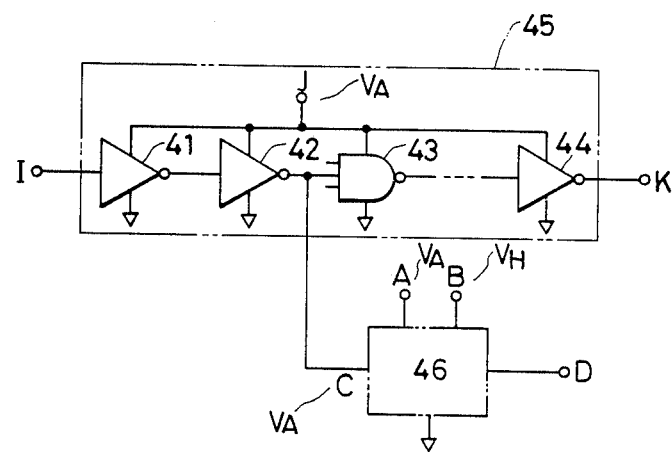
FIG. 44 is a diagram for explaining a nineteenth embodiment of the present invention.

FIGS. 39–43 illustrate examples of application of the present invention applied to the word drivers of the memory. Portions where an input of small amplitude needs to be converted into an output of large amplitude at high speed are not restricted to the word drivers of the memory, but they are extensively existent in the input/output circuits of the memory and other general integrated circuits. FIG. 44 shows such a general example. The illustrated arrangement is such that a signal is derived from a small amplitude circuit system 45 which operates with a reference voltage $V_A$, whereupon a large amplitude output D is obtained using the converter circuit 46 of the present invention. Numerals 41–44 indicate inverters or logic circuits which constitute the system 45, and the source voltage node J of which is supplied with the voltage $V_A$. A high voltage $V_H$ is applied to a node B as the reference voltage of the circuit 46, and if necessary, a D.C. or pulse voltage of the voltage $V_A$ is applied to a node A. Letters A, B, C and D correspond to those in the diagrams of the foregoing embodiments respectively. Such a circuit arrangement is extensively existent in, for example, a part in which a small amplitude input of ECL is converted into a MOS level of large amplitude, or a part in which the small amplitude signal of the sense amplifier of the memory is converted into a large amplitude output of TTL.

Each of the arrangements in FIGS. 20–44 requires the two upper voltages sources of the source for supplying the voltage $V_A$ and the source for supplying the voltage $V_H$. It is of course possible to separately supply the source voltages from outside the chip, but it is also possible to externally supply only one of the voltages and to generate the other inside the chip with reference to the external voltage and supply the generated voltage or to generate both the source voltages insie the chip with reference to another voltage source. Accordingly, those of the preceding embodiments which require the two upper source voltages can also be constructed by the use of a single external upper voltage source in such a way that, for example, the higher one of the two voltages is fed directly from the external upper voltage source, while the lower one is fed by lowering the external upper source voltage by means of a voltage limiter. In some cases, it is also possible to feed the lower one of the two required source voltages from an external upper voltage source and to feed the higher one by raising the voltage of the external upper voltage source by means of a booster circuit.

As the booster circuit, the arrangement described with reference to FIGS. 13 and 14 may be used.

In case of applying this circuit to the embodiment of FIG. 39 or FIG. 43, current which must be fed from the node 194 in FIG. 13 increases when the word line is selected. Accordingly, it is also possible to operate both the booster circuits $CP_1$ and $CP_2$ for producing the great feed current during the period of time during which the semiconductor memory is active, and to operate only the booster circuit $CP_1$ during the period of time during which the memory stands by. Thus, a great output current can be attained with a low power consumption.

As described above, according to the present invention, in a circuit which includes a MOS transistor, a reference operating voltage is set at a value different from the reference operating voltage of a preceding circuit which controls the above circuit, so that a desired output voltage of large amplitude can be obtained.

It is further understood by those skilled in the art that the foregoing description is of preferred embodiments of the disclosed device and that various changes and modifications may be made in the invention without departing from the spirit and scope thereof.

What is claimed is:

1. A semiconductor device comprising:
   a preceding circuit which delivers an output signal of first amplitude in correspondence with an input signal;
   a power source which has a first potential to be fed to said preceding circuit;
   a succeeding circuit which includes at least one bipolar transistor and at least one insulated-gate field effect transistor and to which the output signal of said preceding circuit is applied, said succeeding circuit delivering an output signal of a second amplitude larger than the first amplitude in correspondence with the output signal of said preceding circuit and being supplied with a voltage of a second potential from a power source higher than the first potential;
   said preceding circuit being constructed of a first p-channel MOSFET and a first n-channel MOSFET, gate electrodes of both said MOSFETs being electrically connected to form an input node to which the input signal is applied;
   a source or drain electrode of said first p-channel MOSFET being connected to said power source which has the first potential;
   the drain or source electrode of said first p-channel MOSFET being connected to a source or drain electrode of said first n-channel MOSFET, to form an output node;
   the drain or source electrode of said first n-channel MOSFET being connected to a reference potential;
   said succeeding circuit including a second p-channel MOSFET, a second n-channel MOSFET, a switching means and a first bipolar transistor;
   a gate electrode of said second p-channel MOSFET, a gate electrode of said second n-channel MOSFET and a first electrode of said switching means being electrically connected to form an input node of said succeeding circuit to which the output signal of said preceding circuit is applied;
   a source or drain electrode of said second p-channel MOSFET connected to a power source which has a third potential lower than the second potential;
   a collector electrode of said first bipolar transistor being electrically connected to the power source having the second potential;
   the drain or source electrode of said second p-channel MOSFET, a source or drain electrode of said second n-channel MOSFET and a base electrode of said first bipolar transistor being electrically connected;
   the drain or source electrode of said second n-channel MOSFET being connected to the reference potential;
   an emitter electrode of said first bipolar transistor and a second electrode of said switching means being electrically connected to form an output node which delivers the signal having the second amplitude; and
   the third electrode of said switching means being connected to the reference potential.

2. A semiconductor device according to claim 1, wherein said preceding circuit is a decoder which decodes an address signal, and said succeeding circuit is a word line driver which drives a word line of a memory.

3. A semiconductor device according to claim 1 wherein:
   said switching means is a third n-channel MOSFET and the first, second and third electrodes of the switching means are gate, source and drain electrodes respectively.

4. A semiconductor device according to claim 1 wherein:
   said switching means includes a third p-channel MOSFET, a third n-channel MOSFET; and a second bipolar transistor;
   a drain or source electrode of the third n-channel MOSFET and a collector electrode of the second bipolar transistor is electrically connected to form the second electrode;
   gate electrodes of the third p and n-channel MOSFETs are electrically connected to form the first electrode;
   a source or drain electrode of the third p-channel MOSFET and an emitter electrode of the second bipolar transistor are electrically connected to form the third electrode; and
   the drain or source electrode of the third p-channel MOSFET, the source or drain electrodes of the third n-channel MOSFET and a base electrode of the second bipolar transistor being electrically connected.

5. A semiconductor device comprising:
a preceding circuit which delivers an output signal of first amplitude in correspondence with an input signal;
a power source which has a first potential to be fed to said preceding circuit;
a succeeding circuit which includes at least one bipolar transistor and at least one insulated-gate field effect transistor and to which the output signal of said preceding circuit is applied, said succeeding circuit delivering an output signal of second amplitude larger than the first amplitude in correspondence with the output signal of said preceding circuit and being supplied with a power voltage of second potential from a power source higher than the first potential;
said preceding circuit being constructed of a first p-channel MOSFET and a first n-channel MOSFET, gate electrodes of both said MOSFETs being electrically connected to form an input node to which the input signal is applied;
a source or drain electrode of said first p-channel MOSFET being connected to said power source which has the first potential;
the drain or source electrode of said first p-channel MOSFET being connected to a source or drain electrode of said first n-channel MOSFET, to form an output node;
the drain or source electrode of said first n-channel MOSFET being connected to a reference potential;
said succeeding circuit including a second n-channel MOSFET, a third n-channel MOSFET, a switching means, a first bipolar transistor, and a signal inverter means;
a gate electrode of said second n-channel MOSFET, an input electrode of said signal inverter means being electrically coupled to form an input node of said succeeding circuit to which the output signal of said preceding circuit is applied;
a source or drain electrode of said second n-channel MOSFET being connected to a power source which has a third potential lower than the second potential;
a collector electrode of said first bipolar transistor being electrically connected to the power source which has the second potential;
the drain or source electrode of said second n-channel MOSFET, a source or drain electrode of said third n-channel MOSFET and a base electrode of said first bipolar transistor being electrically connected;
the drain or source electrode of said third n-channel MOSFET being connected to the reference potential;
a gate electrode of the third n-channel MOSFET, an output electrode of the signal inverter means and a first electrode of the switching means being electrically connected; and
an emitter electrode of said first bipolar transistor and a second electrode of said switching means being electrically connected to form an output node which delivers the signal having the second amplitude; and
a third electrode of said switching means being connected to the reference potential.

6. A semiconductor device according to claim 5, wherein:
said preceding circuit is a decoder which decodes an address signal, and said succeeding circuit is a word line driver which drives a word line of a memory.

7. A semiconductor device according to claim 5 wherein:
said switching means is a fourth n-channel MOSFET and the first, second and third electrodes of the switching means are gate, source and drain electrodes respectively.

8. A semiconductor device according to claim 5 wherein:
said switching means includes a second p-channel MOSFET, a fourth n-channel MOSFET, and a second bipolar transistor;
a drain or source electrode of the fourth n-channel MOSFET and a collector electrode of the second bipolar transistor is electrically connected to form the second electrode;
gate electrodes of the second p and fourth n-channel MOSFETs are electrically connected to form the first electrode;
a source or drain electrode of the second p-channel MOSFET and an emitter electrode of the second bipolar transistor are electrically connected to form the third electrode; and
the drain or source electrodes of the second p-channel MOSFET, the source or drain of the fourth n-channel MOSFET and a base electrode of the second bipolar transistor are electrically connected.

9. A semiconductor device comprising:
a preceding circuit which delivers an output signal of first amplitude in correspondence with an input signal;
a power source which has a first potential to be fed to said preceding circuit;
a succeeding circuit which includes at least one bipolar transistor and at least one insulated-gate field effect transistor and to which the output signal of said preceding circuit is applied, said succeeding circuit delivering an output signal of second amplitude larger than the first amplitude in correspondence with the output signal of said preceding circuit and being supplied with a power voltage of second potential higher than the first potential from a power source;
said preceding circuit being constructed of a first p-channel MOSFET and a first n-channel MOSFET, and gate electrodes of both said MOSFETs being electrically connected to form an input node to which the input signal is applied;
a source or drain electrode of said first p-channel MOSFET being connected to said power source which has the first potential;
the drain or source electrode of said first p-channel MOSFET being connected to a source or drain electrode of said first n-channel MOSFET, to form an output node;
the drain or source electrode of said first n-channel MOSFET being connected to a reference potential;
said succeeding circuit including a second p-channel MOSFET, a second n-channel MOSFET, a switching means and a first bipolar transistor;

a gate electrode of said second p-channel MOSFET, a gate electrode of said second n-channel MOSFET and a first electrode of said switching means being electrically connected to form an input node of said succeeding circuit to which the output signal of said preceding circuit is applied;

a source or drain electrode of said second p-channel MOSFET and a collector electrode of said first bipolar transistor being electrically connected to the power source which has the second potential;

the drain or source electrode of said second p-channel MOSFET, a source or drain electrode of said second n-channel MOSFET and a base electrode of said first bipolar transistor being electrically connected;

the drain or source electrode of said second n-channel MOSFET being connected to the reference potential;

an emitter electrode of said first bipolar transistor and a second electrode of said switching means being electrically connected to form an output node which delivers the signal having the second amplitude; and the third electrode of said switching means being connected to the reference potential, and the second potential is increased when the output signal of the succeeding circuit is at a high voltage.

10. A semiconductor device according to claim 9 wherein:

said preceding circuit is a decoder which decodes an address signal, and said succeeding circuit is a word line driver which drives a word line of a memory.

11. A semiconductor device according to claim 9 wherein said switching means is a third n-channel MOSFET and the first, second and third electrodes of the switching means are gate, source and drain electrodes respectively.

12. A semiconductor device according to claim 9 wherein:

said switching means includes a third p-channel MOSFET, a third n-channel MOSFET and a second bipolar transistor;

a drain or source electrode of the third n-channel MOSFET and a collector electrode of the second bipolar transistor is electrically connected to form the second electrode;

gate electrodes of the third p and n-channel MOSFET are electrically connected to form the first electrode;

a source or drain electrode of the third p-channel MOSFET and an emitter electrode of the second bipolar transistor are electrically connected to form a third electrode; and the drain or source electrode of the third p-channel MOSFET, the source or drain electrode of the third n-channel MOSFET and a base electrode of the second bipolar transistor are electrically connected.

* * * * *